(12) United States Patent
Cook

(10) Patent No.: US 10,274,521 B2
(45) Date of Patent: *Apr. 30, 2019

(54) MULTIPLE SENSOR BASED ROGOWSKI COIL

(71) Applicant: Veris Industries, LLC, Tualatin, OR (US)

(72) Inventor: Martin Cook, Tigard, OR (US)

(73) Assignee: Veris Industries, LLC, Tualatin, OR (US)

(*) Notice: Subject to any disclaimer, the term of this patent is extended or adjusted under 35 U.S.C. 154(b) by 117 days.

This patent is subject to a terminal disclaimer.

(21) Appl. No.: 15/178,908

(22) Filed: Jun. 10, 2016

(65) Prior Publication Data

US 2017/0059620 A1 Mar. 2, 2017

Related U.S. Application Data

(60) Provisional application No. 62/213,413, filed on Sep. 2, 2015.

(51) Int. Cl.
*G01R 15/18* (2006.01)

(52) U.S. Cl.
CPC .................. *G01R 15/181* (2013.01)

(58) Field of Classification Search
None
See application file for complete search history.

(56) References Cited

U.S. PATENT DOCUMENTS

| | | | | |
|---|---|---|---|---|
| 4,709,339 | A * | 11/1987 | Fernandes | G01K 1/024 324/127 |
| 5,414,400 | A | 5/1995 | Gris et al. | |
| 5,852,395 | A * | 12/1998 | Bosco | G01R 15/181 336/174 |
| 6,313,623 | B1 | 11/2001 | Kojovic et al. | |
| 7,227,441 | B2 | 6/2007 | Skendzic et al. | |
| 7,227,442 | B2 | 6/2007 | Skendzic | |
| 7,538,541 | B2 | 5/2009 | Kojovic | |
| 7,564,233 | B2 | 7/2009 | Kojovic | |
| 7,902,812 | B2 | 3/2011 | Kojovic | |
| 7,986,968 | B2 | 7/2011 | Dobrowski et al. | |
| 8,330,449 | B2 | 12/2012 | Greenberg | |
| 8,872,611 | B2 | 10/2014 | Rouaud et al. | |
| 9,329,659 | B2 | 5/2016 | Cook | |
| 9,442,139 | B2 | 9/2016 | Hobelsberger et al. | |
| 9,448,258 | B2 | 9/2016 | Garabieta et al. | |
| 2004/0183522 | A1 | 9/2004 | Gunn | |
| 2008/0191704 | A1 | 8/2008 | Gholami et al. | |
| 2011/0012587 | A1 | 1/2011 | Greenberg | |
| 2011/0043190 | A1 | 2/2011 | Farr | |
| 2016/0055963 | A1 | 2/2016 | Lockstedt et al. | |
| 2016/0091535 | A1 | 3/2016 | Bannister et al. | |
| 2017/9959621 | | 3/2017 | Cook | |
| 2017/9959622 | | 3/2017 | Cook | |
| 2017/9959623 | | 3/2017 | Cook | |
| 2017/9959624 | | 3/2017 | Cook | |
| 2017/9959625 | | 3/2017 | Cook | |

FOREIGN PATENT DOCUMENTS

WO 2006108021 A2 10/2006
WO 2012022779 A1 2/2012

* cited by examiner

*Primary Examiner* — Paresh H Patel
(74) *Attorney, Agent, or Firm* — Chernoff, Vilhauer, McClung & Stenzel, LLP

(57) ABSTRACT

A coil that includes one or more sensors.

24 Claims, 27 Drawing Sheets

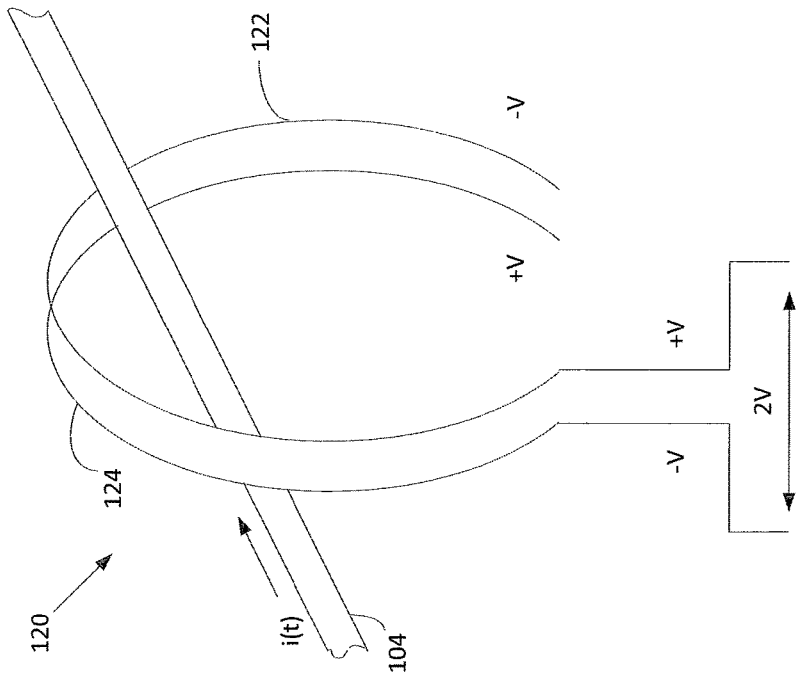
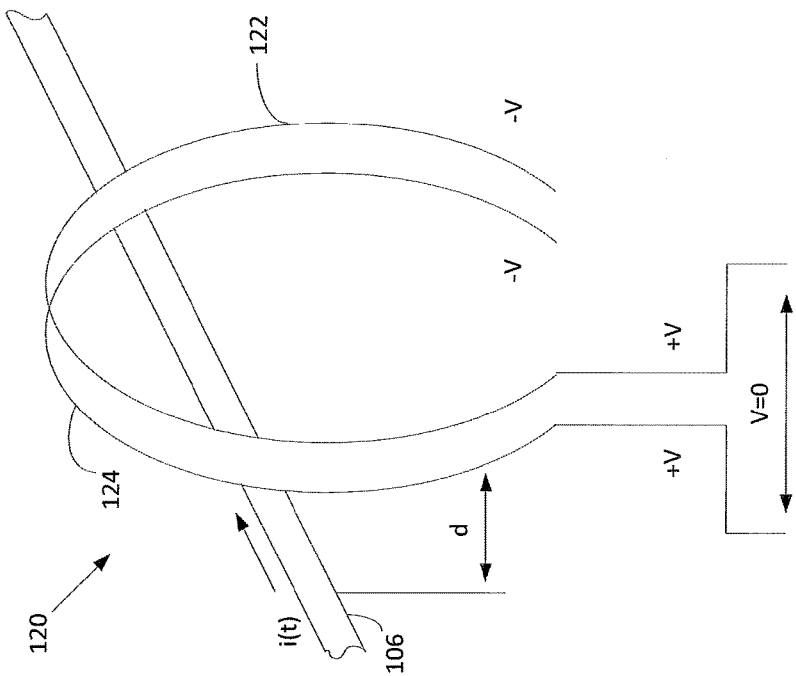
FIG. 2A PRIOR ART
FIG. 2B PRIOR ART

MULTIPLE SENSOR BASED ROGOWSKI COIL

CROSS-REFERENCE TO RELATED APPLICATIONS

This application claims the benefit of U.S. Provisional App. No. 62/213,413, filed Sep. 2, 2015.

TECHNICAL FIELD

The present disclosure relates generally to a Rogowski coil.

BACKGROUND OF THE INVENTION

A number of different types of measurement devices may be utilized to detect or monitor current signals. For example, measurement devices are typically integrated into utility meters in order to monitor the current on one or more phases of an electrical power signal. In conventional devices, current transformers, shunts, and Hall Effect transducers are traditionally used to monitor current signals. More recently, Rogowski coils have been utilized to monitor current signals. With a Rogowski coil, current flowing through a conductor generates a magnetic field that induces a voltage in the coil. Using the voltage output signal of the coil, current conditions within the conductor can be calculated.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 2A illustrates a modified Rogowski coil.

FIG. 2B illustrates a further modified Rogowski coil.

DETAILED DESCRIPTION OF PREFERRED EMBODIMENT

Figure 1:
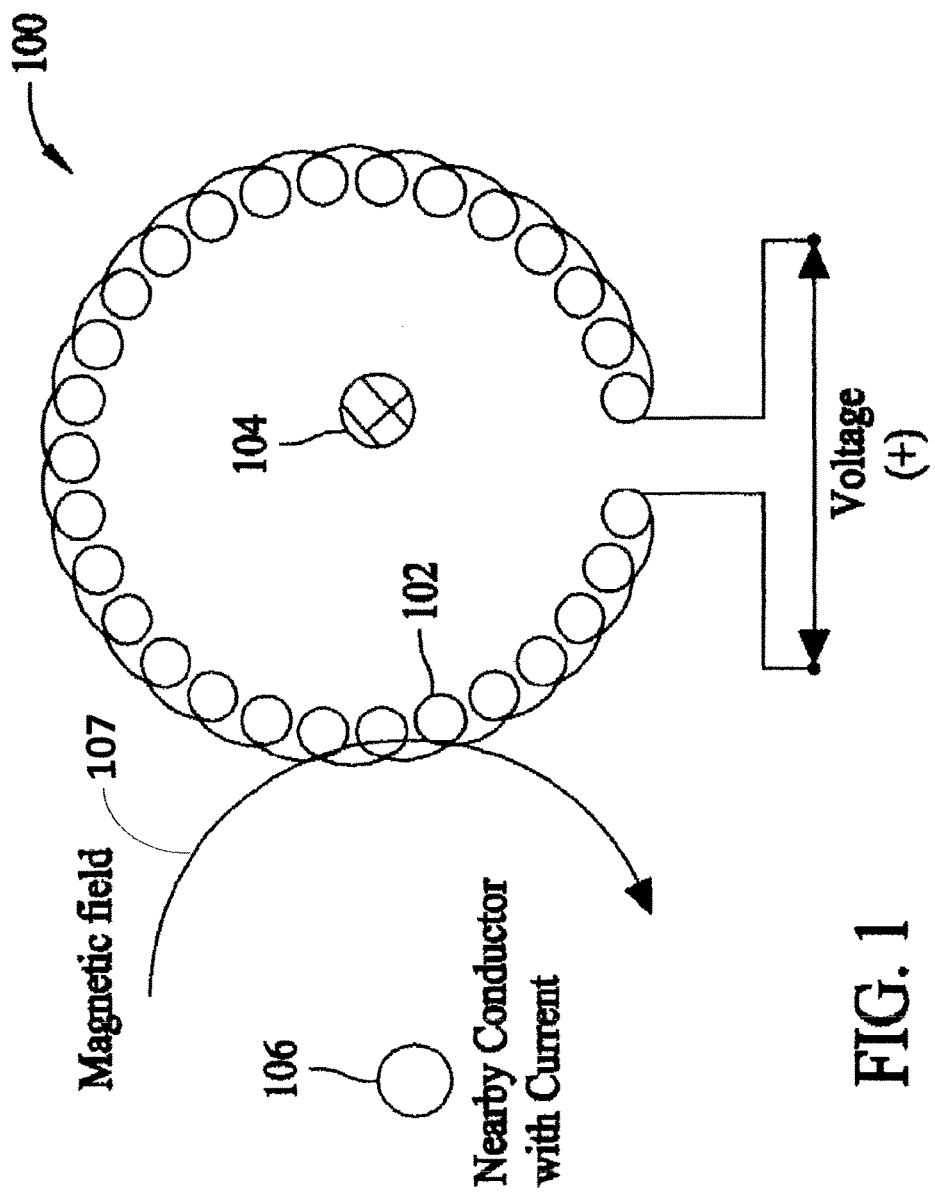
FIG. 1 illustrates a Rogowski coil, an internal conductor, and an external conductor.

Referring to FIG. 1, a Rogowski coil 100 is generally fabricated from a conductor 102, that may include a wire, that is coiled or wound on a substantially non-magnetic core, which may be, for example, air or a substantially non-magnetic material. The 102 coil may be placed around a conductor or conductors 104 whose current(s) is to be measured with the coil 102. A primary current flowing through the conductor 104 generates a magnetic field that, in turn, induces a voltage in the coil 102. A voltage output v(t) of the coil 102 is generally governed by the following Equation:

$$v(t) = -\mu_o \mu_r n S [d\, i(t)/d\, t] \approx -M[d\, i(t)/d\, t].$$

where $\mu_o$, is the magnetic permeability of free space, $\mu_r$ is the relative permeability (the ratio of the permeability of the coil 102 to the permeability of free space $\mu_o$), n is the winding density (turns per unit length), S is the cross sectional area of the core in the Rogowski coil, and M represents the mutual reactance or mutual coupling between the coil 102 and the conductor 104. In a similar manner, the output of the coil may be a current signal i(t).

For an ideal Rogowski coil 102, M is independent of the location of the conductor 104 within the coil 102. The Rogowski coil output voltage v(t) is proportional to the rate of change of the measured current i(t) flowing in the conductor 104. The coil output voltage v(t) may be integrated to determine the current i(t) in the conductor 104.

Referring also to FIG. 2A, to reduce undesirable influence of a nearby conductor 106, which generates an electromagnetic field 107, a coil 120 may include first and second wire coils or loops 122, 124 wound in electrically opposite directions. The two coils 122, 124 effectively cancel substantially all electromagnetic fields coming from outside the coil 120. One or both loops 122, 124 may be configured from a wound wire on the core. If only one loop wire wound on a non-magnetic core is utilized, then the other loop may be returned through the center of the coil 120 to cancel undesirable effects of external magnetic fields.

Referring also to FIG. 2B, both loops 122 and 124 may include wound wires, with the second winding 124 being wound in the opposite direction. In this configuration, the voltage induced in the coil 120 from the conductor passing through the coil will be doubled.

Figure 3:
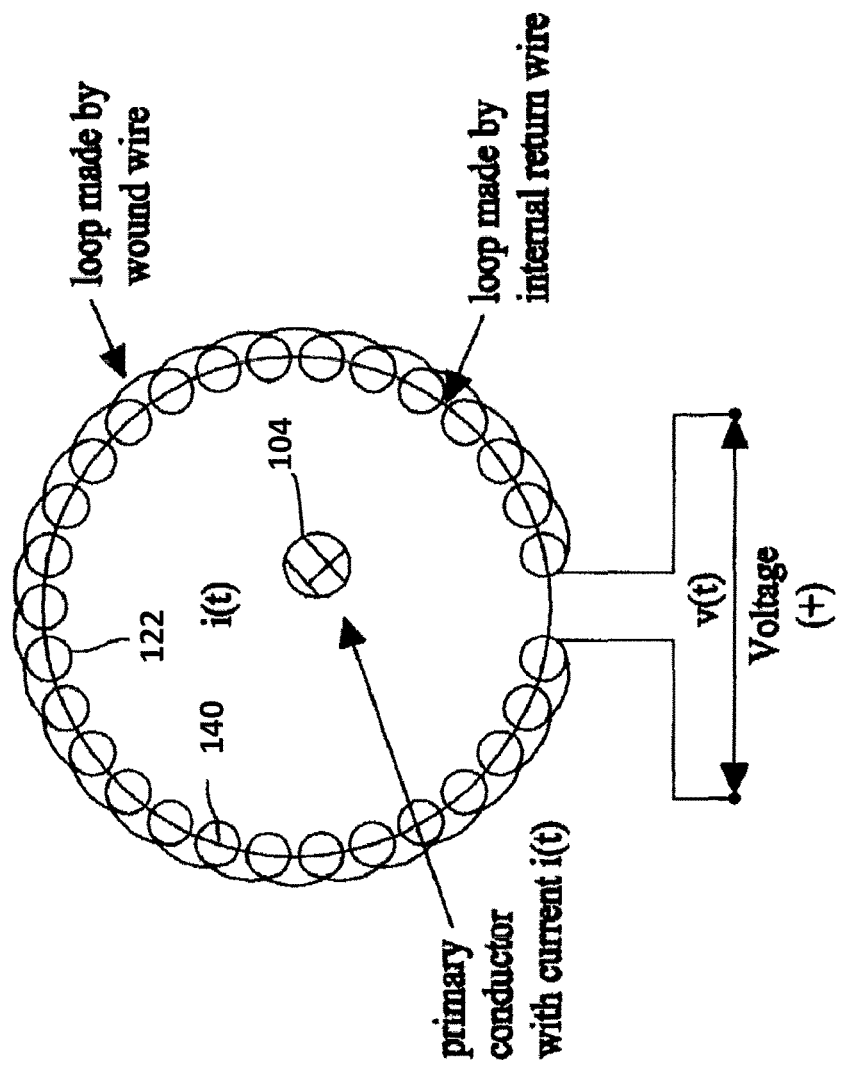
FIG. 3 illustrates a further modified Rogowski coil.

Referring to FIG. 3, a Rogowski coil may include a substantially flexible, nonmagnetic core 140 such as cores commonly used in known coaxial cables. Insulating jackets and shielding from such cables, may be stripped to obtain the cores, and after cutting the cable core to size, the coil 122 (and 124) may be wound over the core 140. Existing conductors extending through the center of the core 140 may serve as the return loop for reduction of external magnetic fields, as described above. In lieu of such flexible cores 140, coils may be fabricated from relatively rigid and straight rods that may be manufactured with a more uniform cross sectional area than the flexible cores. In lieu of such flexible cores 140, coils may be fabricated on dielectric material, such as a patterned circuit board.

The output of the coils tend to be susceptible to noise, signal distortion, and undesirable influences by surrounding conductors and equipment in the vicinity of the coils. To reduce such influences shielding may be included.

Figure 4:
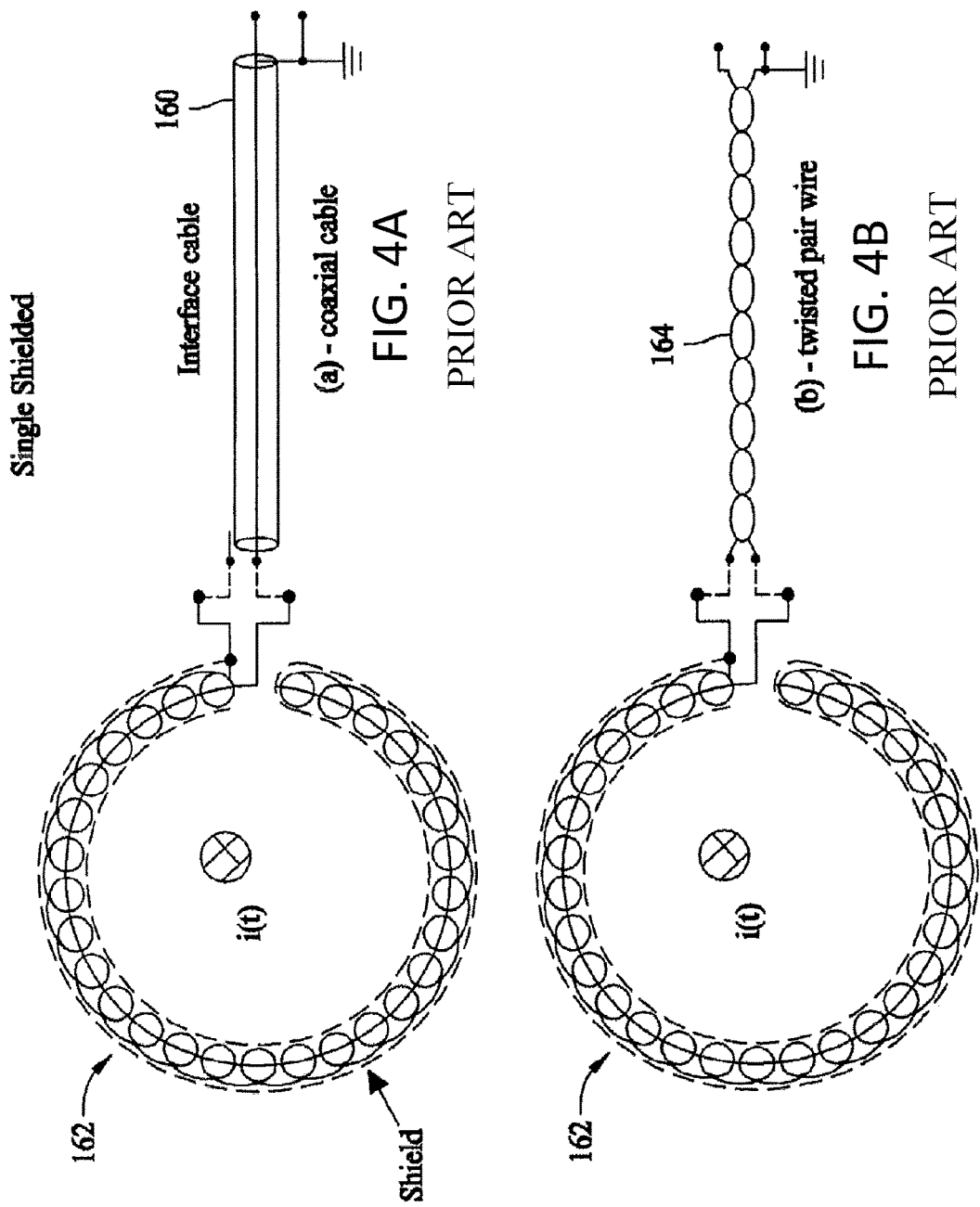
FIG. 4A illustrates a further modified Rogowski coil and connection.
FIG. 4B illustrates a further modified Rogowski coil and connection.

Referring to FIG. 4A, the Rogowski coil and its secondary leads may include a shielded coaxial cable 160 that is connected to a coil 162. Referring to FIG. 4B, a twisted pair wire 164 is connected to the coil 162. The twisted wires carry equal but opposite signals and are less susceptible to noise issues and cross talk issues from adjacent signal conductors. The shielded cable 160 and the twisted pair wire 164 provide protection against noise and electromagnetic influences in the environment of the coils 162.

Figure 5:
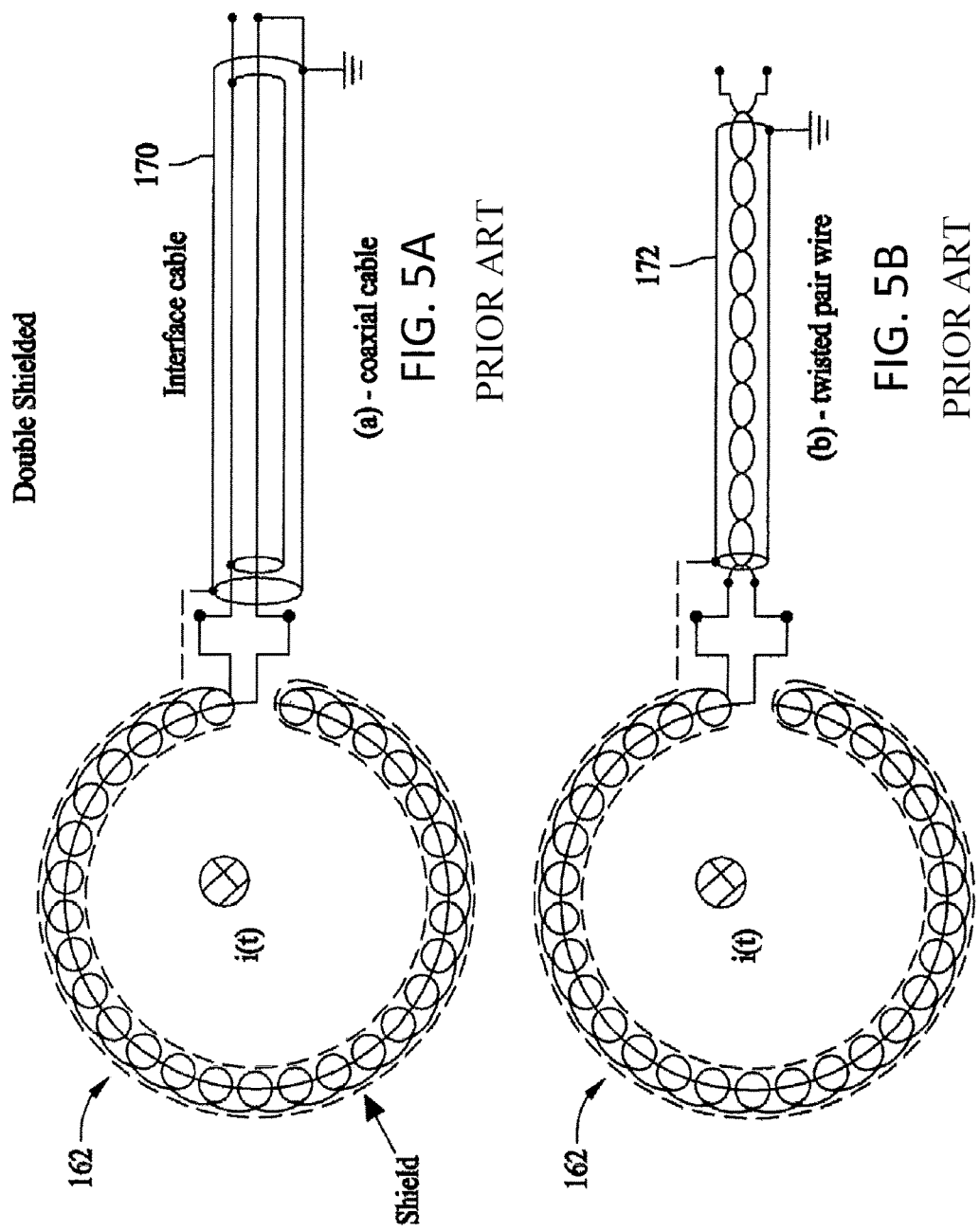
FIG. 5A illustrates a further modified Rogowski coil and connection.
FIG. 5B illustrates a further modified Rogowski coil and connection.

FIGS. 5A and 5B illustrate another approach for improving the integrity of the coil output signals. FIG. 5A illustrates a double shielded cable 170 having concentric layers of insulation around the signal conductors in the cable. FIG. 5B illustrates a shielded twisted pair wire 172. The double shielding shown in FIGS. 5A and 5B are more effective than the single shielding features shown in FIGS. 4A and 4B.

Figure 6:
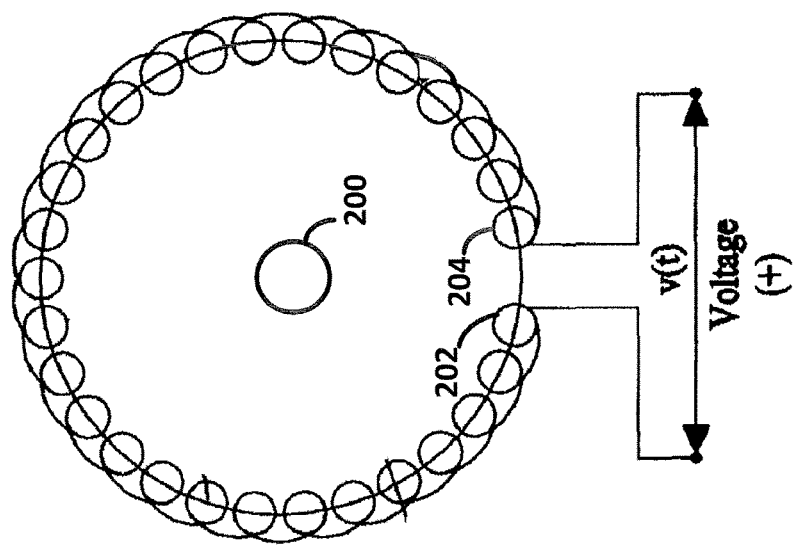
FIG. 6 illustrates a further modified Rogowski coil and connection.
Figure 7:
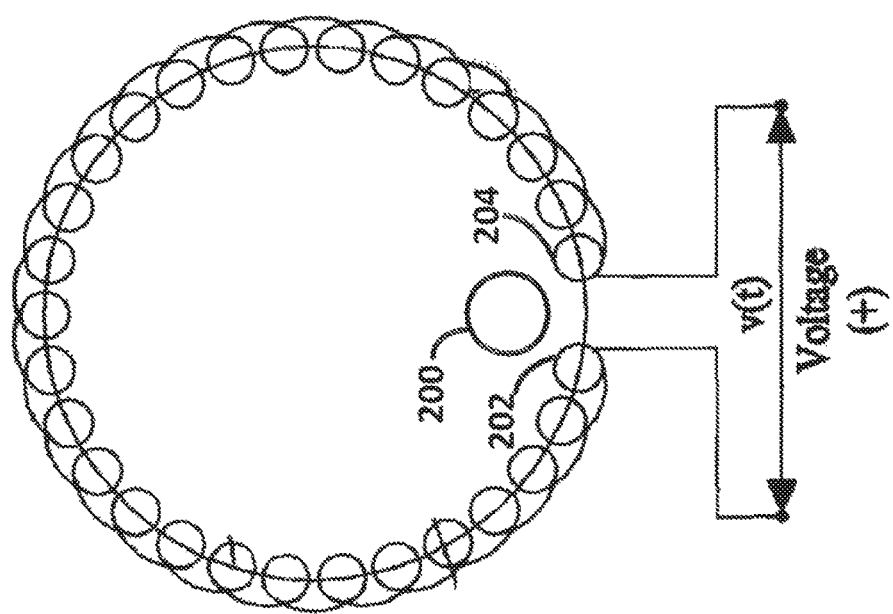
FIG. 7 illustrates a further modified Rogowski coil and connection.
Figure 8:
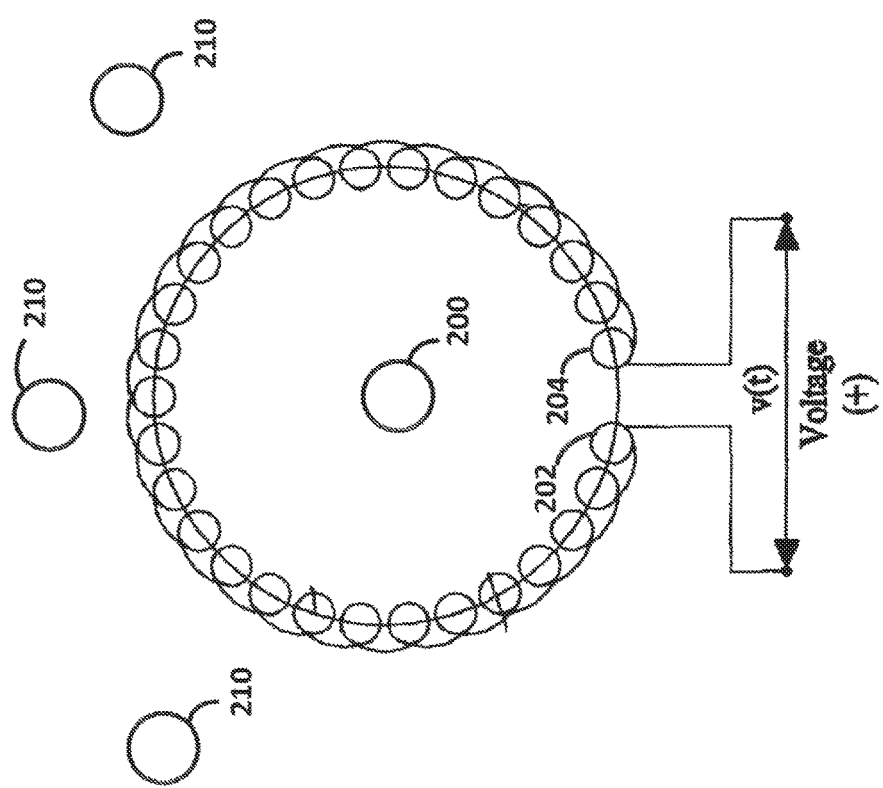
FIG. 8 illustrates a further modified Rogowski coil and connection.

As described, the Rogowski coil may be flexible in shape in order to readily open and close it on the conductor to be measured. This flexibility is especially useful when installing the Rogowski coil around conductors with limited or irregular space constraints. However, the closure system between the ends of the loops from a mechanical perspective (e.g., precision of the positioning of the two ends of the loop) and from an electrical perspective (e.g., the electrical discontinuity of the electrical fields) results in a non-uniformity of the measuring of the fields within the loop. Referring to FIG. 6, a first measurement may be made based upon a first conductor 200 centered within the loop. The measurement will be incorrect due to the non-uniform field created by the closure system between the ends 202, 204 of the loop. Referring to FIG. 7, a second measurement may be made based upon the first conductor 200 located proximate the closure system within the loop. The measurement will be incorrect due to the non-uniform fields created by the closure system within the loop. Referring to FIG. 8, the measurement tends to be incorrect, even with external fielding canceling techniques, due to the non-uniform field created by one or more external conductors 210 in addition to the non-uniform field created by the closure system between the ends 202, 204 of the loop.

Figure 9:
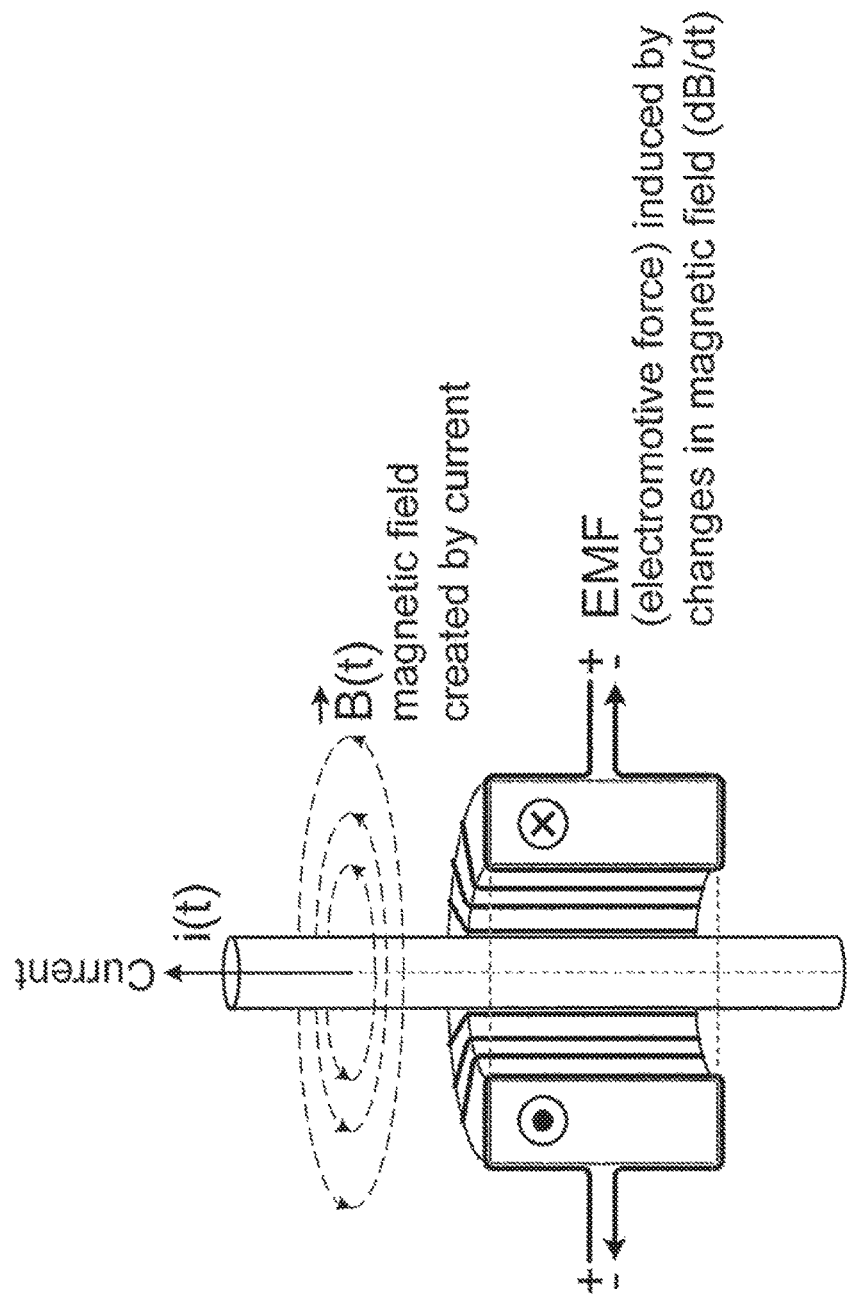
FIG. 9 illustrates a Rogowski coil and its electromotive force.

Referring to FIG. 9, an exemplary diagram of a Rogowski coil arranged around a long straight wire perpendicular to the magnetic field is shown, illustrating the magnetic field (B field) generated by the current i(t). Moreover, as previously described, the EMF may be generally determined by EMF=−Md(i)/dt.

Figure 10:
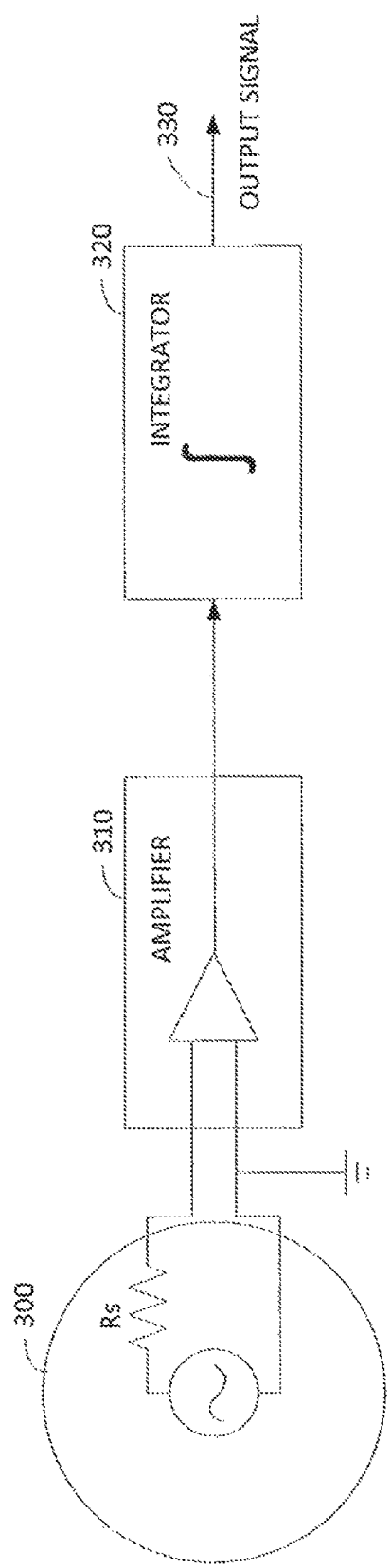
FIG. 10 illustrates a Rogowski coil, together with an amplifier and an integrator.

Referring to FIG. 10, since the output signal from the Rogowski coil 300 tends to be relatively small the signal is preferably amplified using a suitable amplification circuit 310. The output of the amplification circuit 310 is then preferably integrated using an integrator 320 to provide an output signal 330 indicative of the current. The integrator 320 preferably includes compensation for a 90 degree phase shaft and a 20 dB/decade gain generated by the Rogowski coil. It is to be understood that the amplification and/or integration may be performed using firmware using any computing process.

Figure 11:
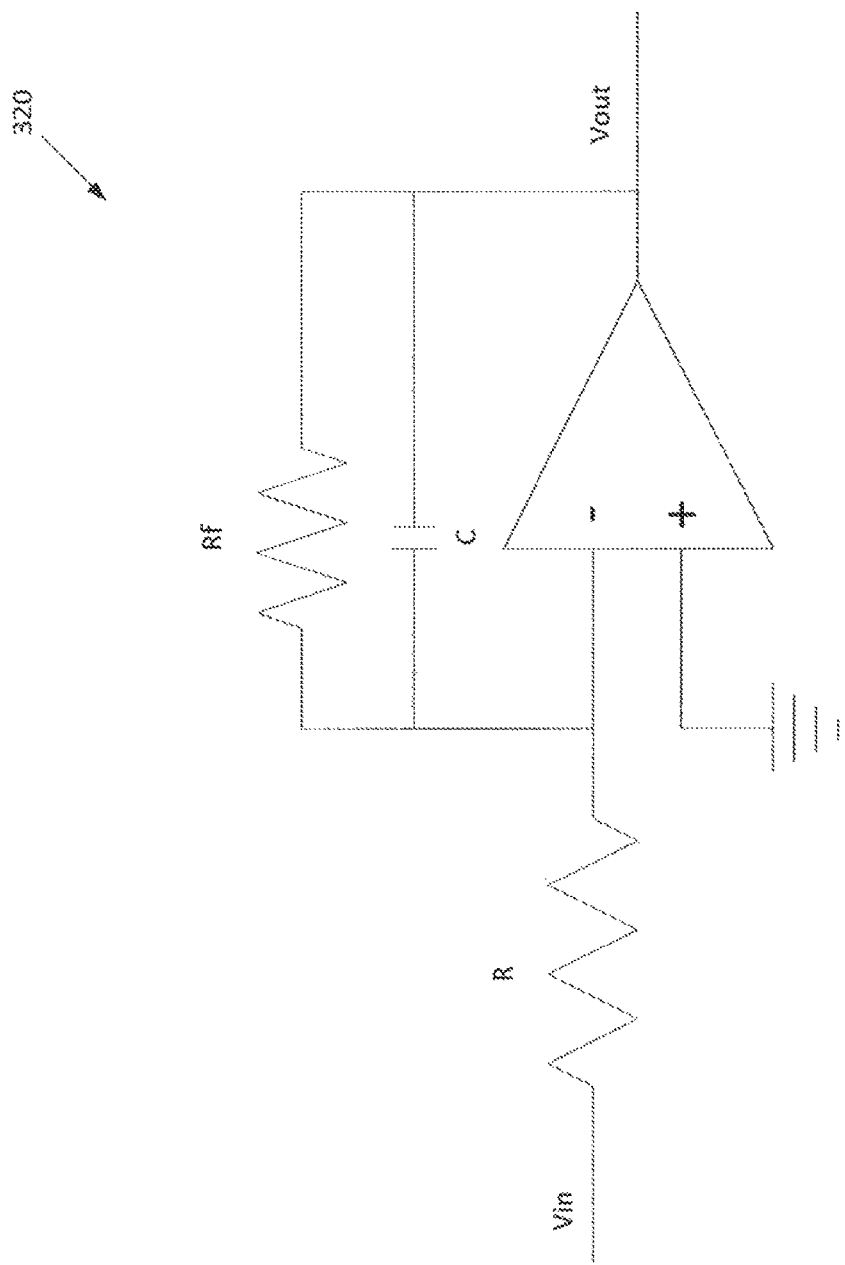
FIG. 11 illustrates an integrator.

Referring to FIG. 11, an exemplary integrator 320 may include an inverting operational amplifier and a resistor-capacitor circuit.

Figure 12:
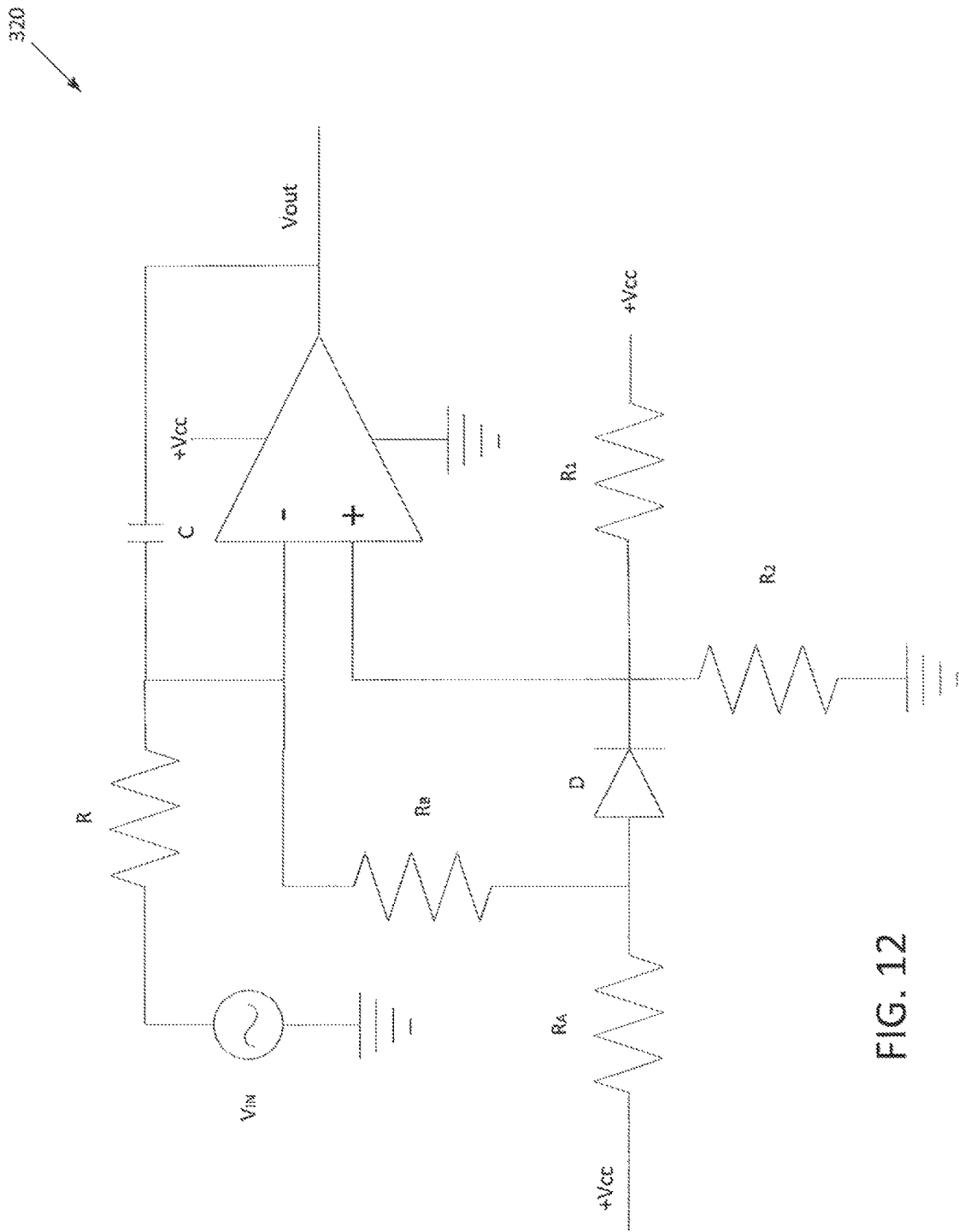
FIG. 12 illustrates another integrator.

Referring to FIG. 12, an exemplary integrator 320 may include an operational amplifier with input current compensation. The resistors R1 and R2 are relatively small, and the resistor $R_B$ is relatively large.

Figure 13:
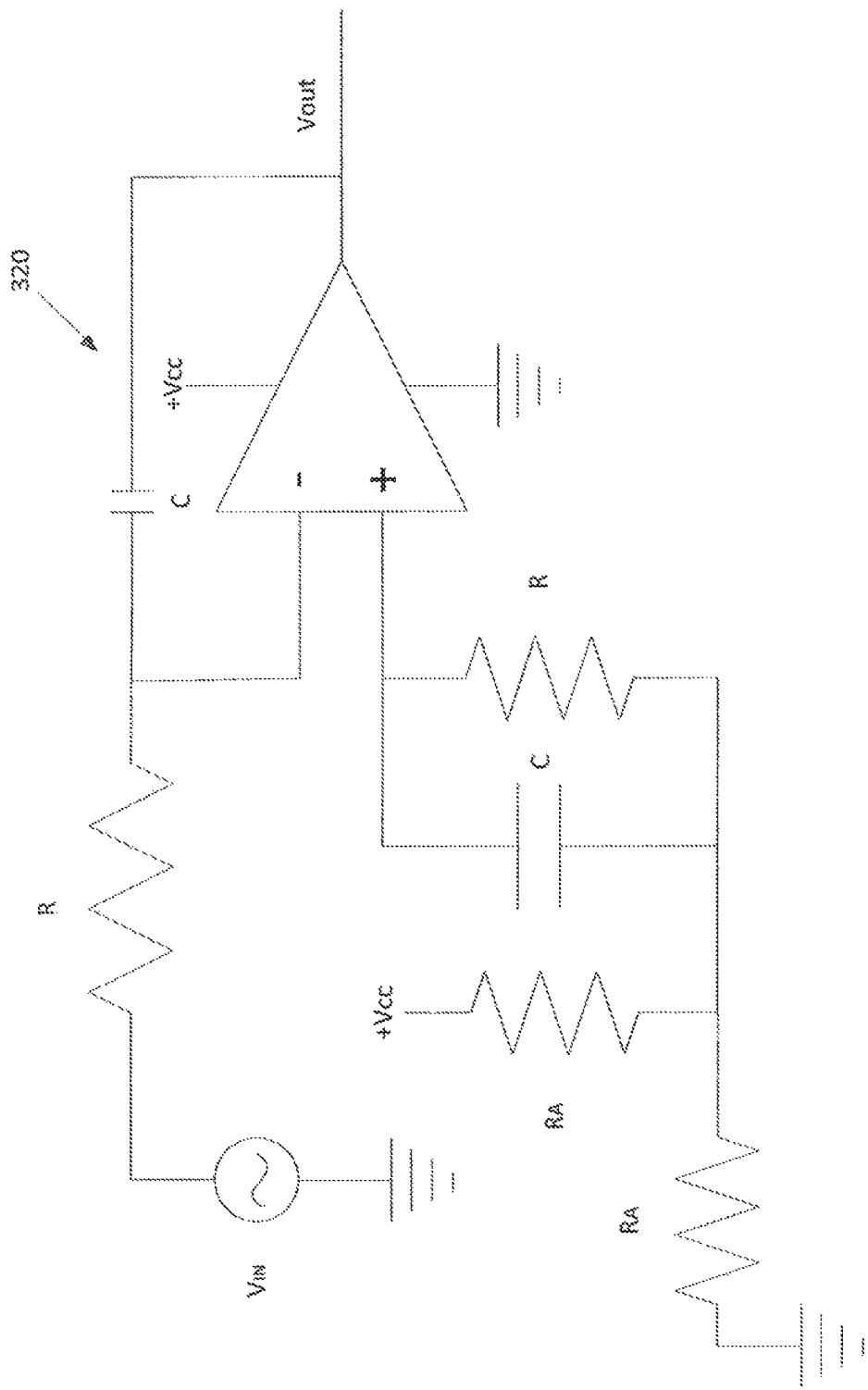
FIG. 13 illustrates another integrator.

Referring to FIG. 13, an exemplary integrator 320 may include an operational amplifier with drift compensation. The positive input current drops the same voltage across the parallel RC combination as the negative input current drops across its series RC combination.

Figure 14A:
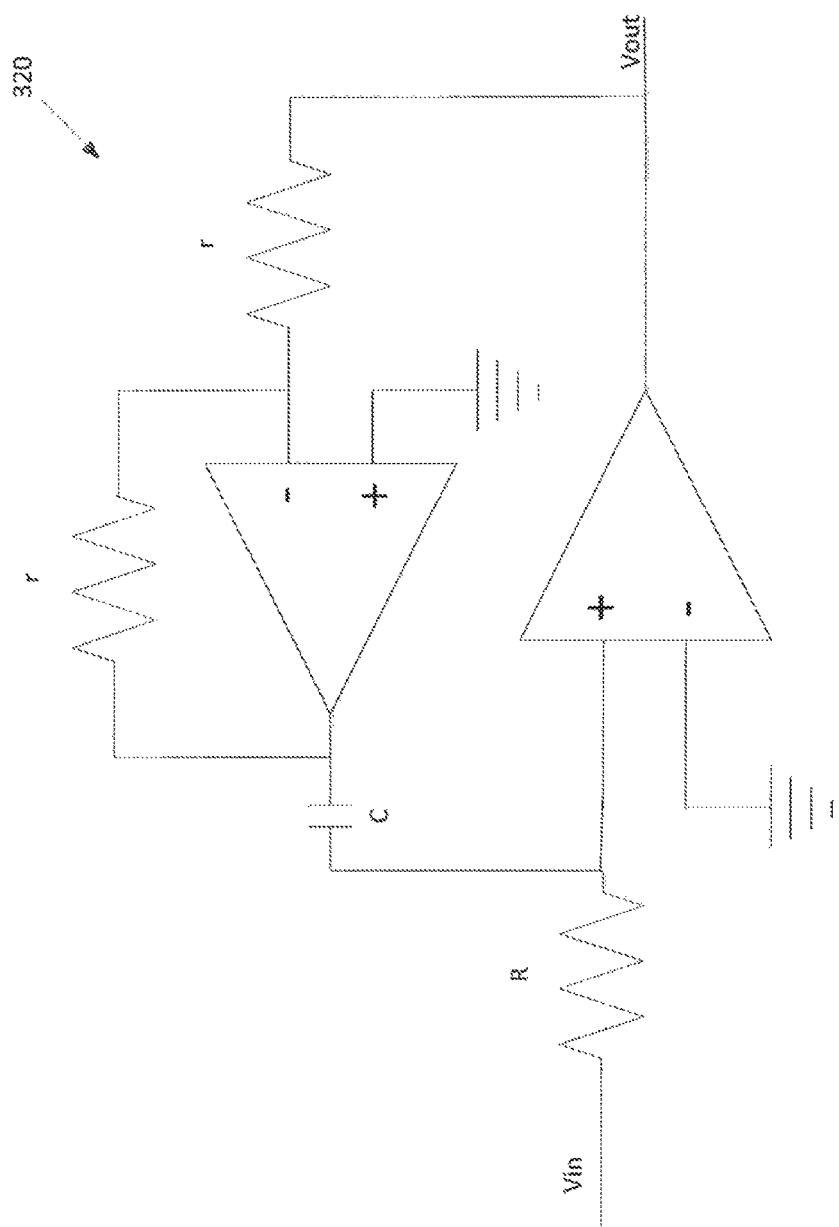
FIGS. 14A-B illustrate other integrators.
Figure 14B:
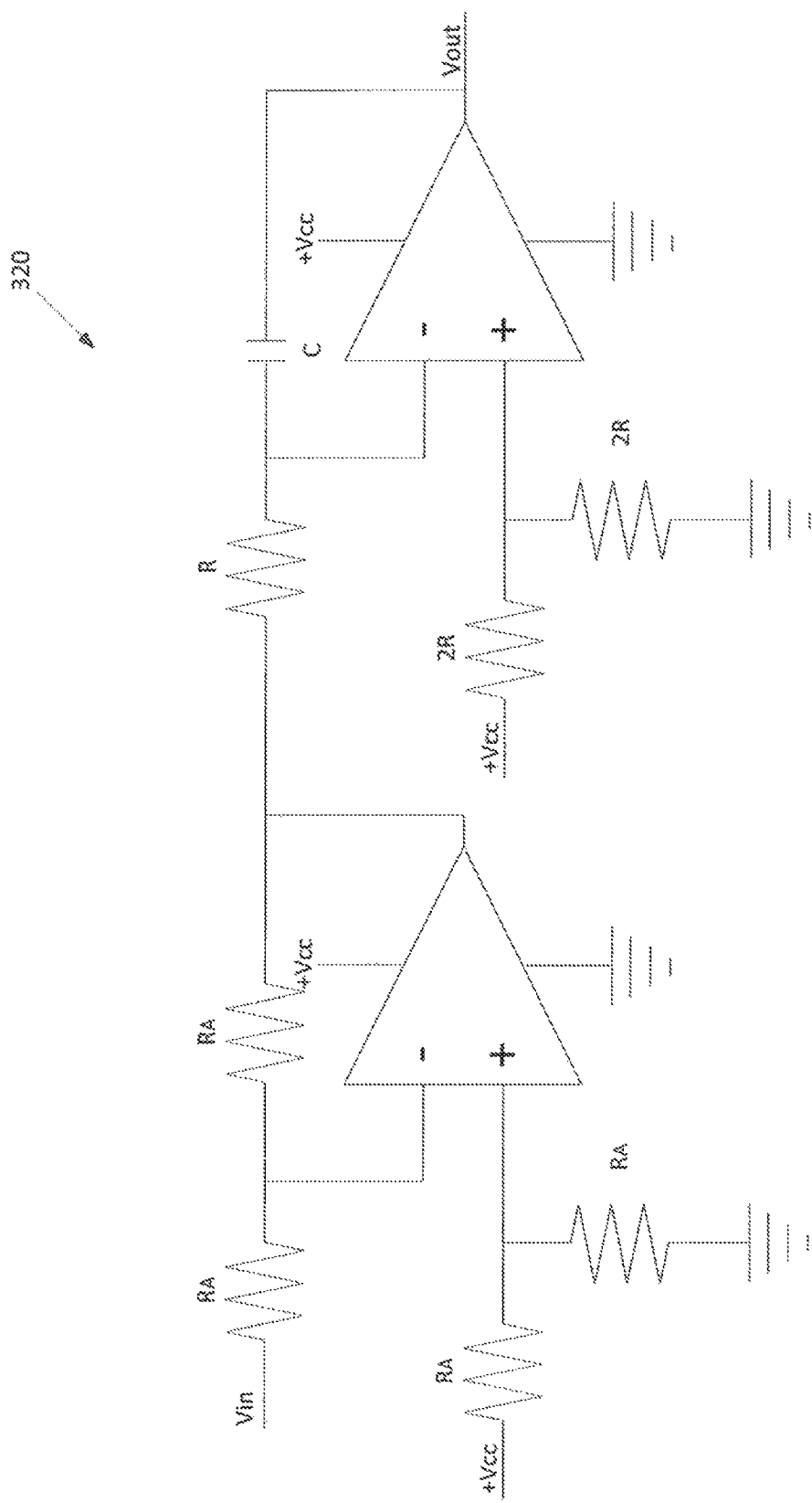

Referring to FIGS. 14A-B, an exemplary integrator 320 may include two operational amplifiers with a non-inverting integrator and an inverting buffer.

Figure 15:
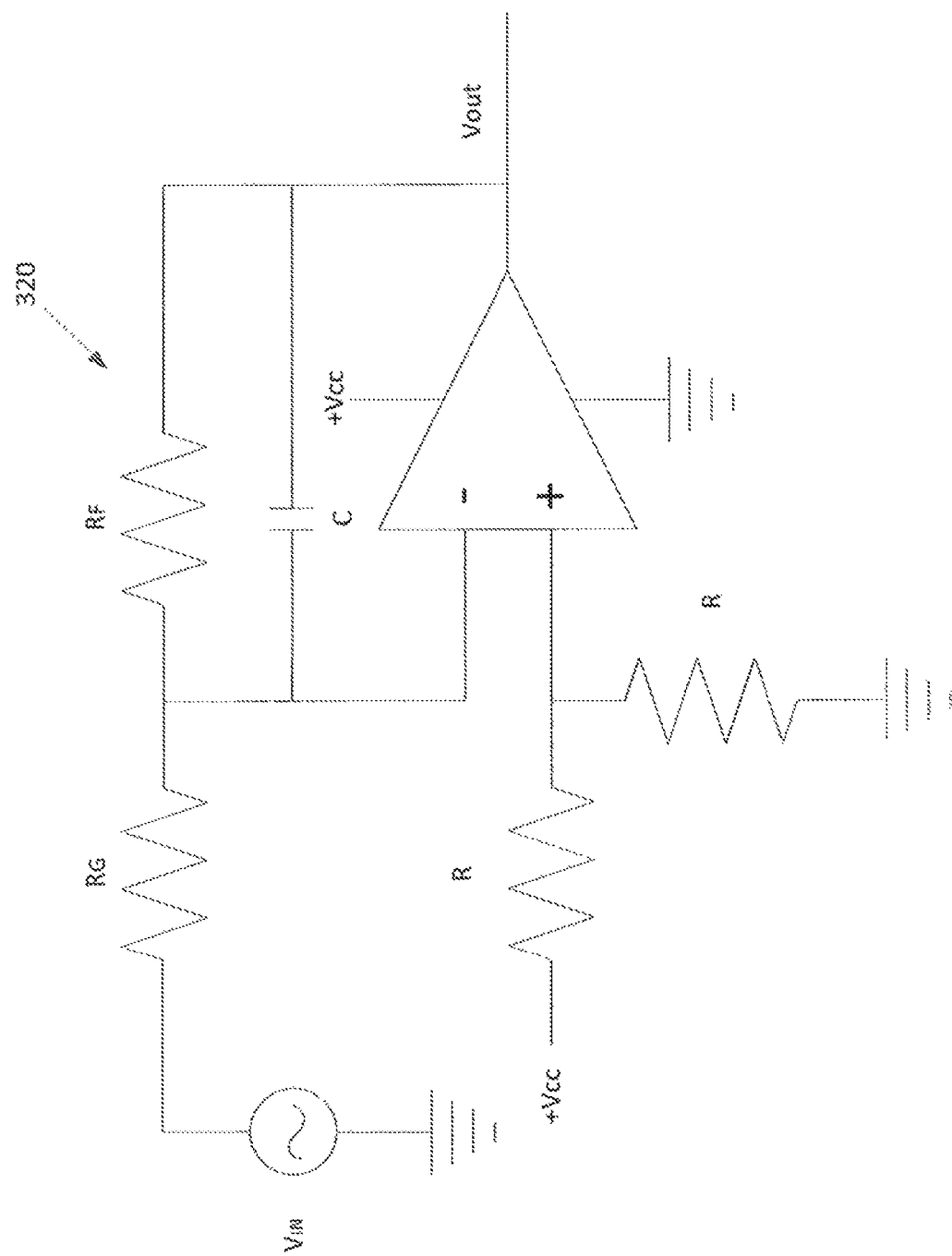
FIG. 15 illustrates another integrator.

Referring to FIG. 15, an exemplary integrator 320 may include an operational amplifier with an inverting integrator with a resistive reset.

Figure 16:
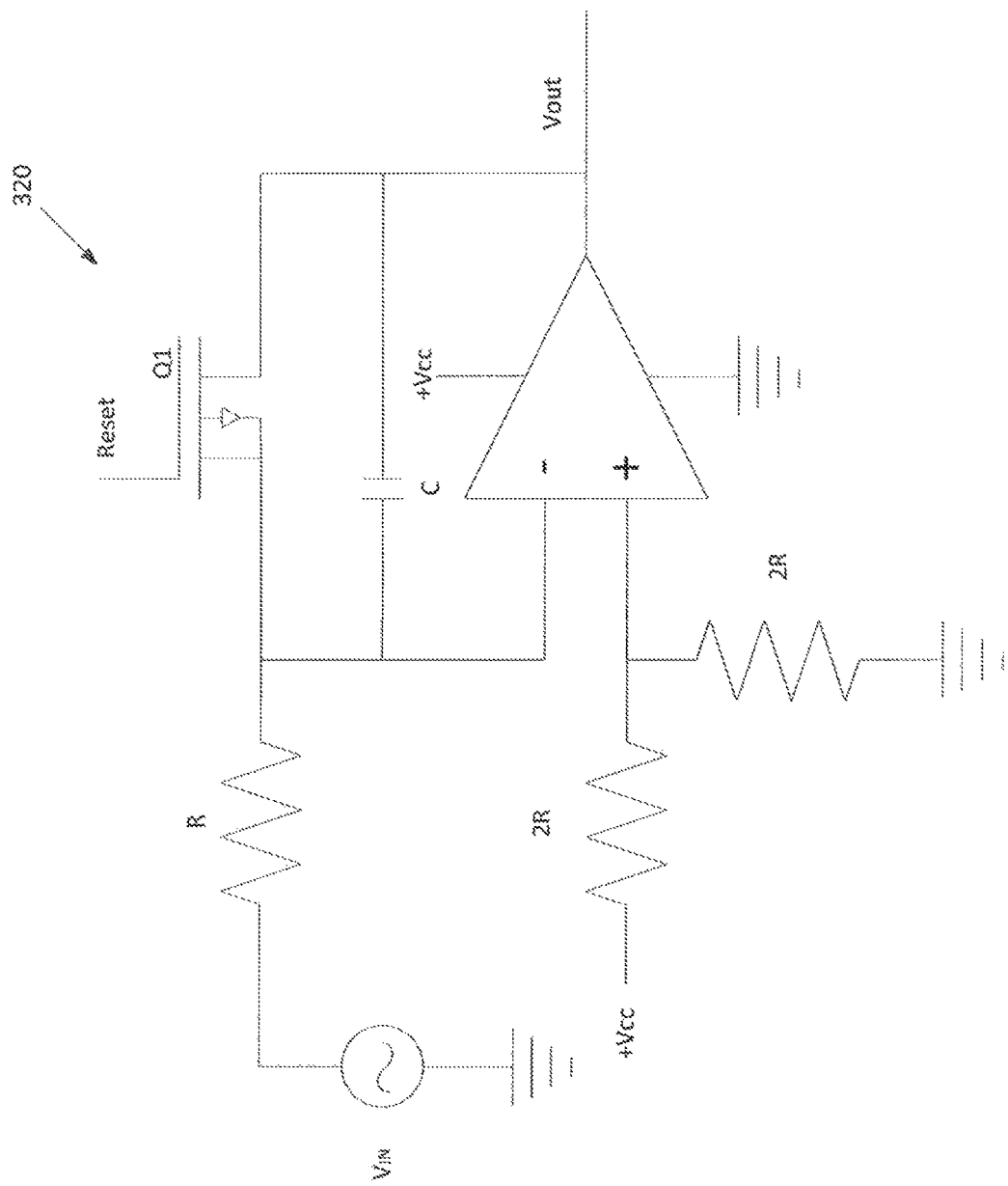
FIG. 16 illustrates another integrator.

Referring to FIG. 16, an exemplary integrator 320 may include an operational amplifier with an inverting integrator with an electronic reset.

It is to be understood that other active circuits may likewise be used, as desired. It is to be understood that a digital integrator may be used, if desired. It is to be understood that passive circuits may likewise be used, as desired.

Figure 17:
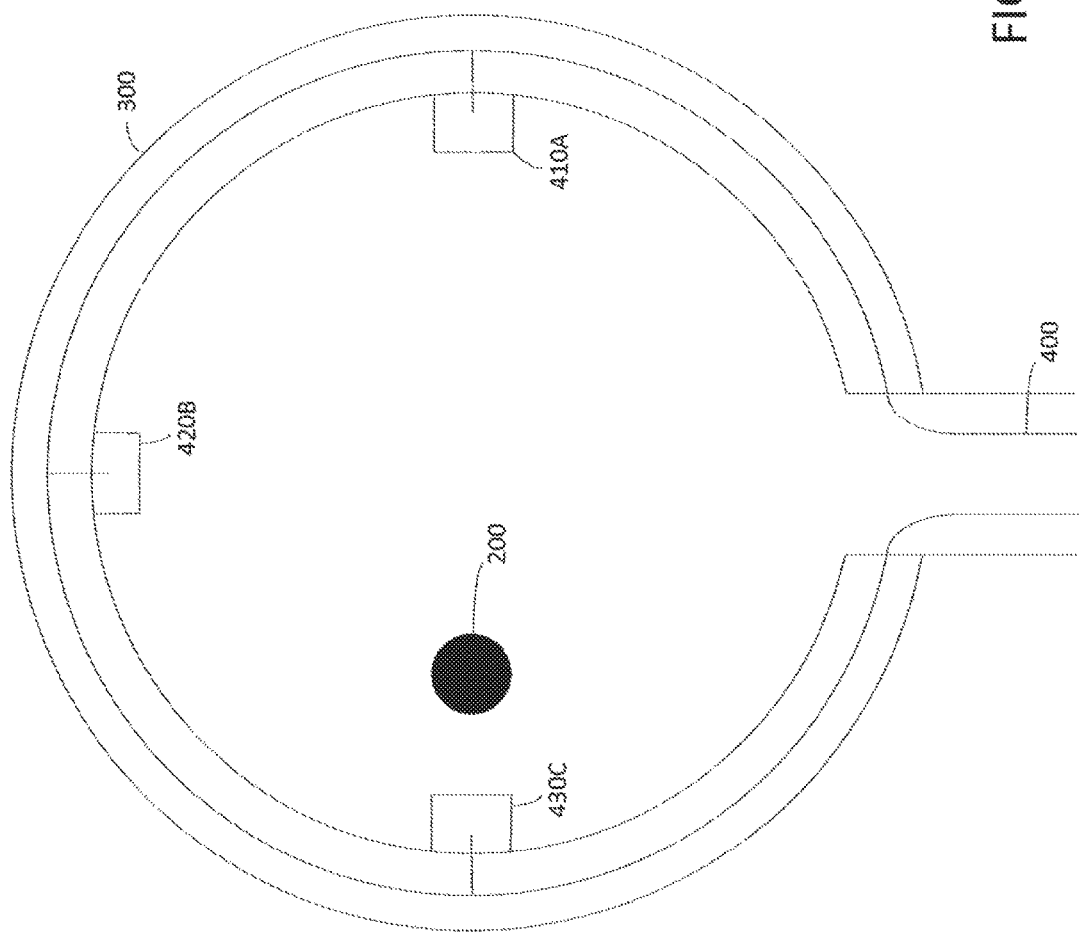
FIG. 17 illustrates a Rogowski coil with a plurality of sensors.

Referring to FIG. 17, the Rogowski coil 300 may include one or more additional conductors 400 that extend along the length of the coil 300 to provide power to a set of spaced apart sensors 410, 420, and/or 430. Preferably, the coil supports at least three sensors 410, 420, 430, although fewer or additional sensors may be included, as desired. The sensors are preferably maintained at a fixed position with respect to the coil 300 and are not movable with respect to the coil 300. In this manner, the spatial relationship of the sensors relative to one another along the length of the coil is generally known. Moreover, when the sensors 410, 420, 430 are arranged in a generally circular arrangement the spatial relationship of the sensors 410, 420, 430 with respect to one another is also generally known. In addition, the spatial relationship of the sensors 410, 420, 430 with respect to the closure system between the ends of the coil 300 is also generally known.

Each of the sensors 410, 420, 430 may measure the magnitude of the magnetic field generated by the conductor 200 at spaced apart locations, such as for example, RMS. For example, sensor 430 may measure the magnitude of the conductor 200 as C; sensor 420 may measure the magnitude of the conductor 200 as B; and sensor 410 may measure the magnitude of the conductor 200 as A, where each of the sensors are similarly calibrated. Since the conductor 200 is not centered within the coil 300, each of the sensors 410, 420, 430, will sense a different magnitude. The magnitude C will be greater than the magnitude B, which in turn will be greater than the magnitude A. Based upon the positions of the sensors relative to one another, together with the sensed magnitudes, the position of the conductor 200 within the coil 300 may be determined. If desired, the sensors may be powered by the same power that is used for the amplifier and/or integrator. The signals indicative of the sensed power within the conductor 200 from each of the sensors 410, 420, 430, may be provided along one or more of the conductors 400. Also, the sensors 410, 420, 430 may be unpowered spaced apart sensors where the amplifier and/or integrator is used to obtain a sensed signal from each.

Figure 18:
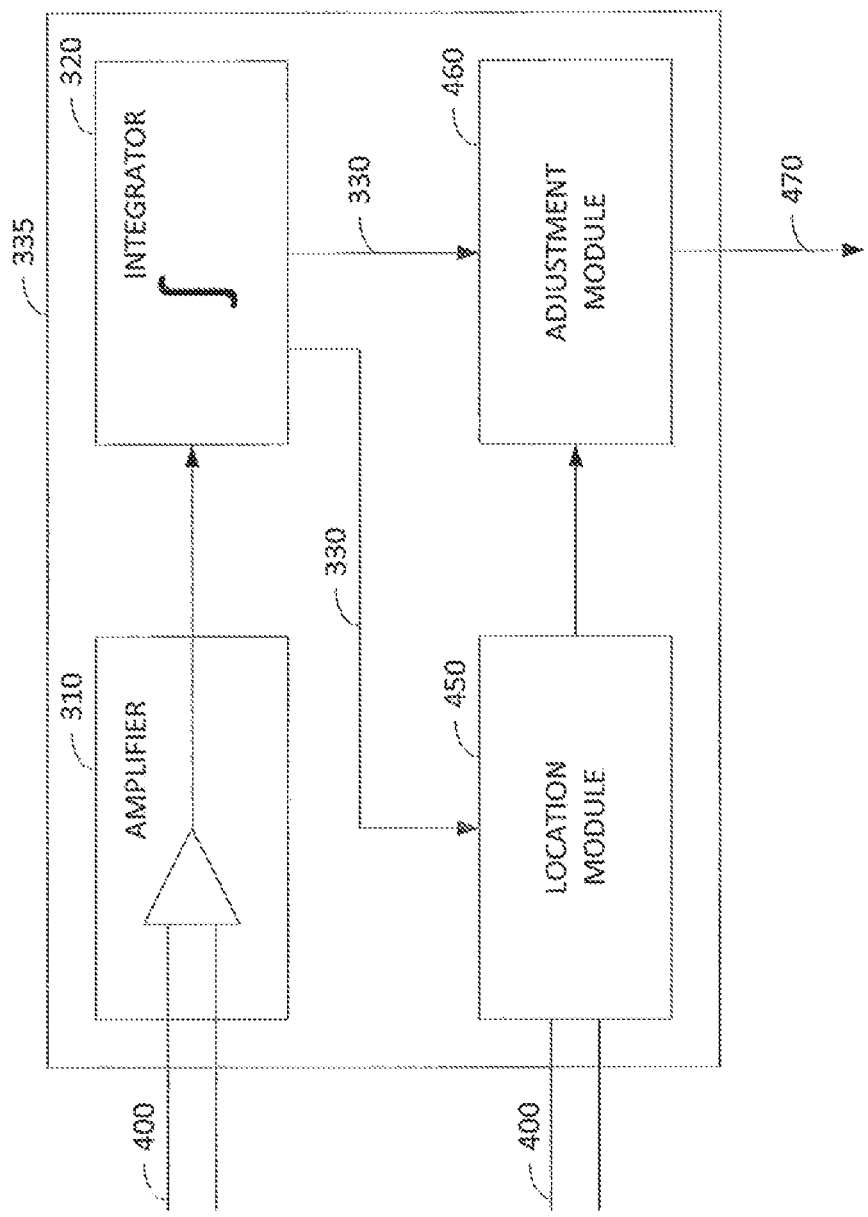
FIG. 18 illustrates an amplifier, integrator, location module, and adjustment module.

Referring to FIG. 18, each of the output signals from the coil may be amplified 310 and integrated 320, as previously described. Each of the output signals may be separately amplified and/or time multiplexed by a single amplifier (e.g., two or more output signals for each amplifier and/or integrator). The magnitude of the output signals 330 are different based upon the location of the wire within the Rogowski coil in addition to the wire's proximity to the closure portion, if desired. A location module 450 receives the data from the sensors 410, 420, 430, such as for example, the amplified and integrated signal from each of the sensors, and determines the relative location of the conductor 200 within the coil 400. For example, the signals from the current sensors may be separately amplified and/or integrated to determine an overall magnitude for the signal in the wire. For example, the signals from the current sensors may be averaged together or summed together or otherwise, to obtain a form of a composite signal which is then amplified and/or integrated. An adjustment module may receive the signals from the location module 450 and use such data to modify the output signals 330 to determine an appropriate signal for the coil 400 indicative of its magnitude. The location module 450 and the adjustment module 460 may be combined, as desired. Any number of sensors may be used, as desired.

Figure 19:
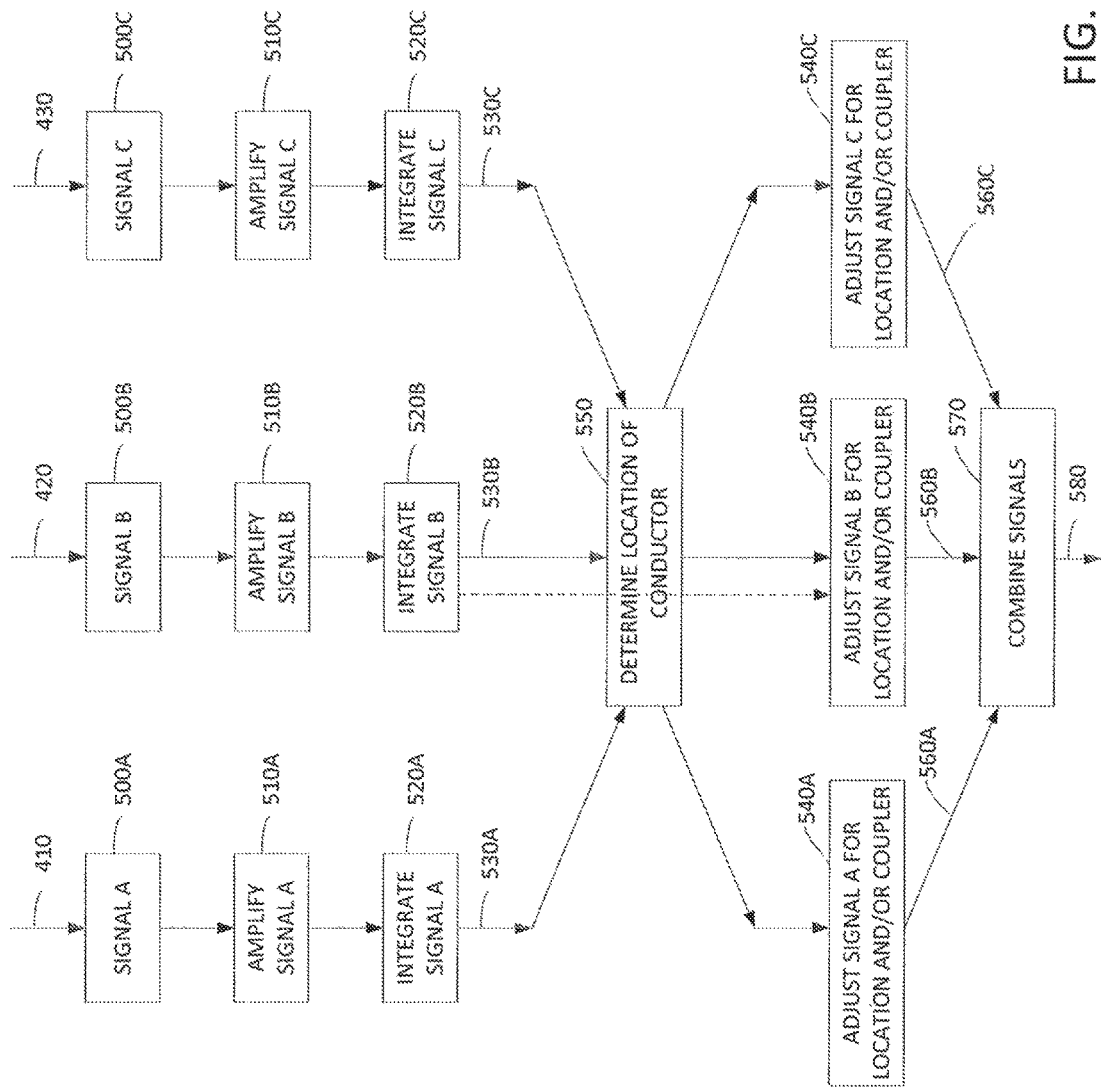
FIG. 19 illustrates another Rogowski coil with a plurality of sensors.

Referring to FIG. 19, one technique to process the signals from the sensors is illustrated. The signal A 500A from sensor 410 is amplified 510A and integrated 520A, the signal B 500B from sensor 420 is amplified 510B and integrated 520B, and the signal C 500C from sensor 430 is amplified 510C and integrated 520C.

The sensor A 410 which is the basis for an integrated signal A 530A has a generally known relationship to the coupler and therefore an approximate adjustment factor 550 may be determined based upon the location of the conductor relative to the coupler. For example, the signal A may be adjusted by a first factor 540A to adjust for the lack of magnetic coupling by the coupler.

The sensor B 420 which is the basis for the integrated signal B 530B has a generally known relationship to the coupler and therefore an approximate adjustment factor 550 may be determined based upon the location of the conductor relative to the coupler. For example, the signal B may be adjusted by a second factor 540B to adjust for the lack of magnetic coupling by the coupler.

The sensor C 430 which is the basis for the integrated signal C 530C has a generally known relationship to the coupler and therefore an approximate adjustment factor 550 may be determined based upon the location of the conductor relative to the coupler. For example, the signal C may be adjusted by a third factor 540C to adjust for the lack of magnetic coupling by the coupler.

The integrated signal A 530A, the integrated signal B 530B, and the integrated signal C 530C may be used to determine the location of the conductor 550. By way of example, the differences in the magnitude of the integrated signals A, B, C may be used to determine the location of the conductor, such as by using a triangulation technique. The location of the conductor 550 may thus be used to determine, at least in part, the adjustment signals 540A, 540B, 540C.

The process may adjust 540A the integrated signal A 530A based upon the location of the conductor relative to the coupler to provide an adjusted signal 560A. The process may adjust 540B the integrated signal B 530B based upon the location of the conductor relative to the coupler to provide an adjusted signal 560B. The process may adjust 540C the integrated signal C 530C based upon the location of the conductor relative to the coupler to provide an adjusted signal 560C.

The first, second, and third factors may be different to adjust for the difference in the distance between the conductor and the relative sensor. The distance between the conductor and the relative sensor may be determined in any manner, such as determining the difference in the magnitudes sensed by the conductors. The first, second, and third factors may be different to adjust for the difference in the relative relationship of the conductor to the coupler.

The adjusted signals 560A, 560B, 560C, may be combined 570 to determine a corresponding value for the signal in the conductor 200. By way of example, the adjusted signals 560A, 560B, 560C may be averaged together, if desired. This increases the accuracy of the signal that is determined. An output signal 580 from the combine signals 570 may provide adjusted magnitude information of the current in the conductor 200.

Figure 20:
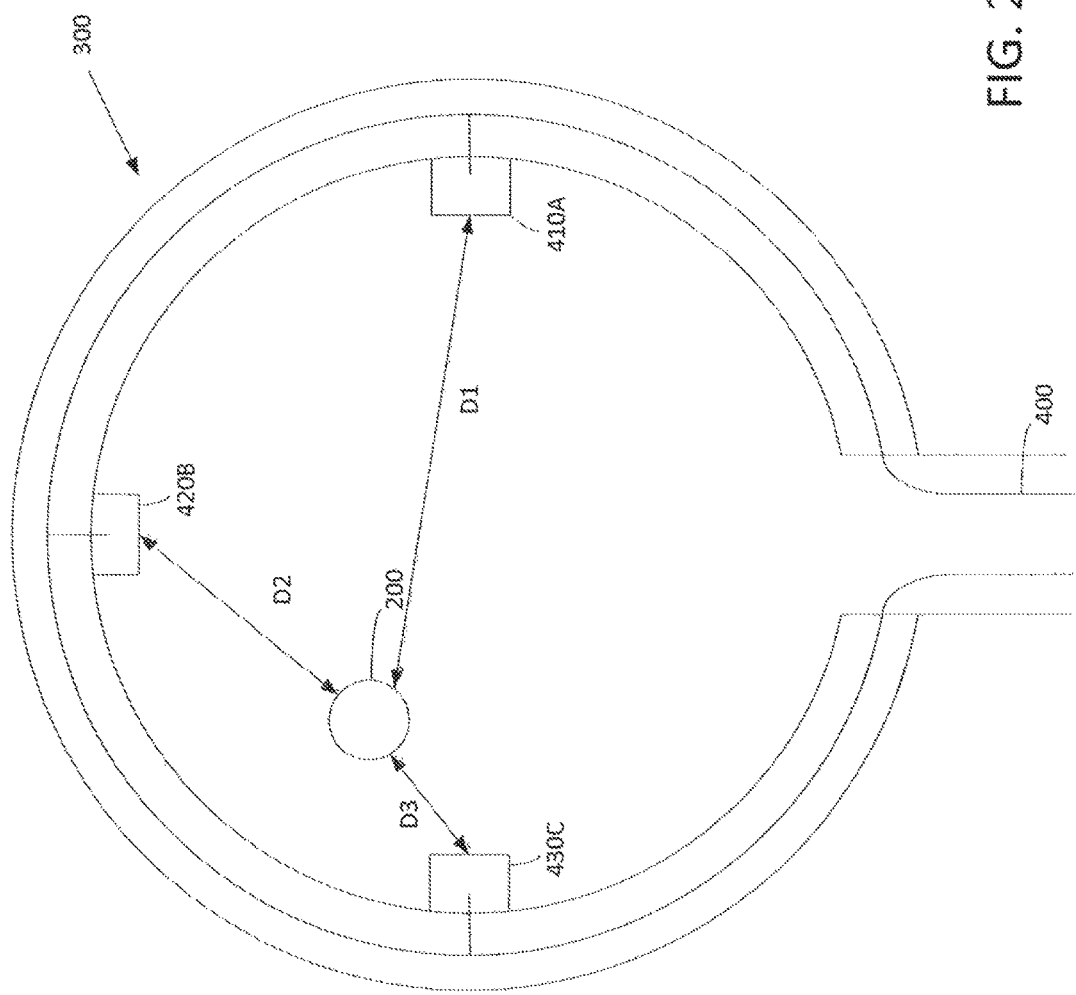
FIG. 20 illustrates a distance determination to a conductor.

Referring to FIG. 20, the location module 550 may determine the position of the conductor 200 as a position within the loop. For example, a distance measure D1 may be determined that estimates the distance of the conductor 200 from the sensor 410. For example, a distance measure D2 may be determined that estimates the distance of the conductor 200 from the sensor 420. For example, a distance measure D3 may be determined that estimates the distance of the conductor 200 from the sensor 430. The distances D1, D2, D3 may be used to determine the position of the conductor 200 within the coil 300 which may be used for an adjustment.

Figure 21:
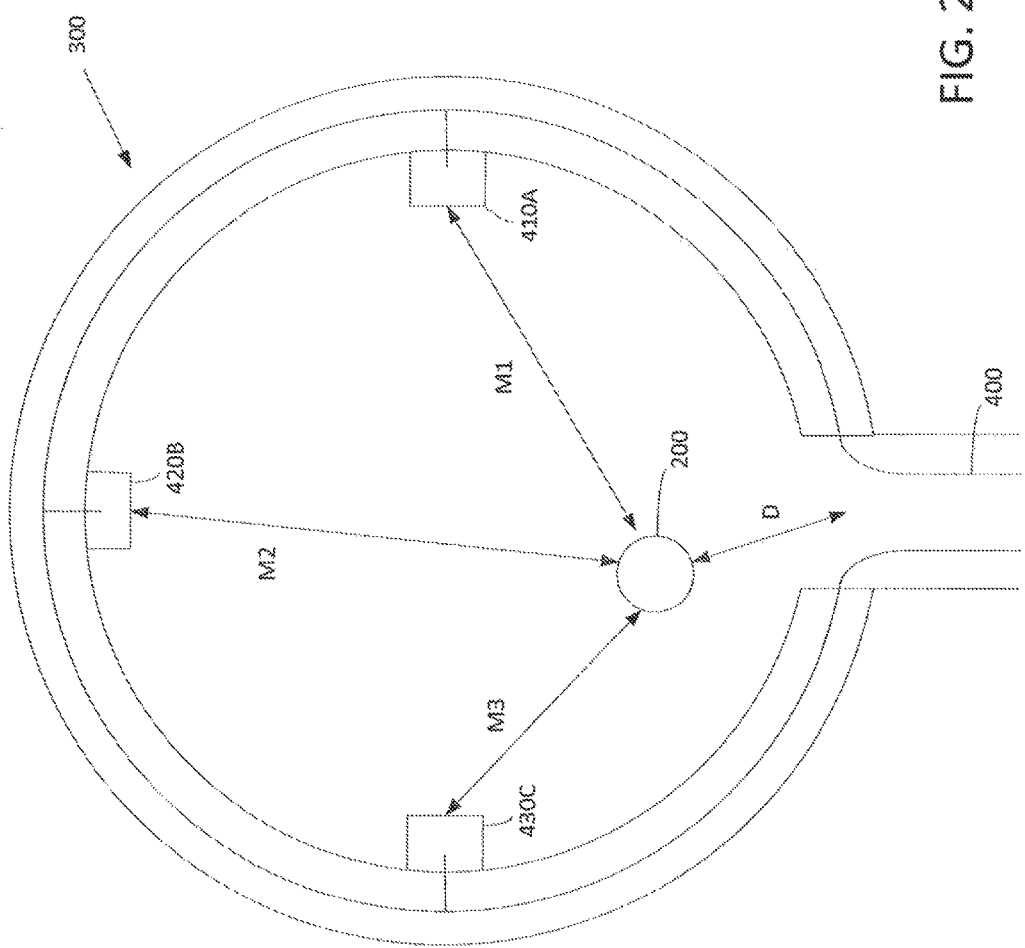
FIG. 21 illustrates an offset for a conductor for a connector.

Referring to FIG. 21, the location module 550 may determine an offset value indicative of an adjustment corresponding to the location of the conductor 200 within the loop to account for the proximity of the conductor 200 to the connector. For example, a magnitude measure M1 may be determined that estimates the magnitude of the conductor 200 from the sensor 410. For example, a magnitude measure M2 may be determined that estimates the magnitude of the conductor 200 from the sensor 420. For example, a distance measure M3 may be determined that estimates the magnitude of the conductor 200 from the sensor 430. The magnitudes M1, M2, M3 may be used to determine an offset value for the conductor 200 within the coil 300. By way of example, the offset value may be based upon an estimated distance D from the coupling.

Figure 22:
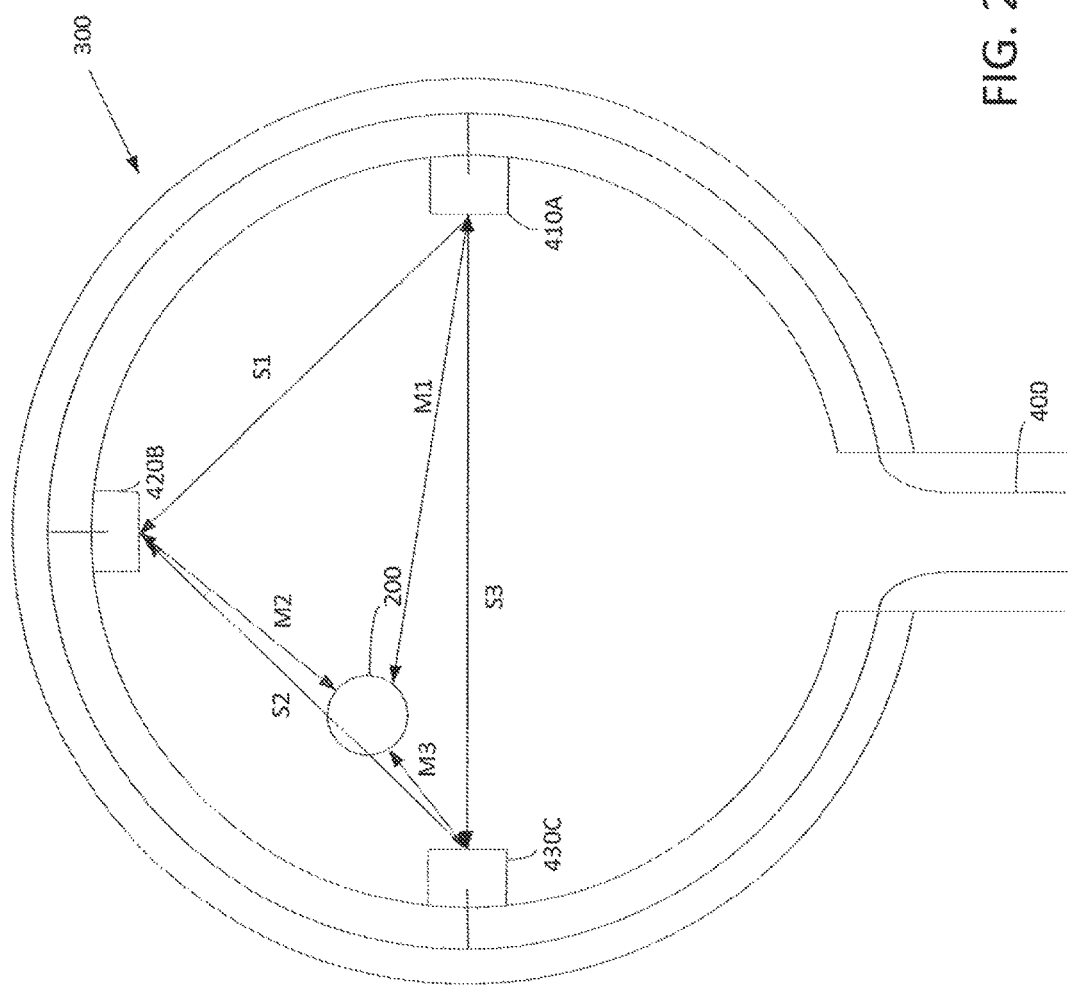
FIG. 22 illustrates an adjustment for a conductor to a connector.

Referring to FIG. 22, the location module 550 may determine whether the position of the conductor 200 within the loop is sufficiently close to the closure mechanism so that an adjustment is desirable. For example, a sufficiency measure S1 may be determined that estimates the difference in the sensed magnitude of the conductor 200 from the sensors 410A (sensing magnitude M1) and 420B (sensing magnitude M2). For example, a sufficiency measure S2 may be determined that estimates the difference in the sensed magnitude of the conductor 200 from the sensors 420B (sensing magnitude M2) and 430C (sensing magnitude M3). For example, a sufficiency measure S3 may be determined that estimates the difference in the sensed magnitude of the conductor 200 from the sensors 430C (sensing magnitude M3) and 410A (sensing magnitude M1). The sufficiency measures S1, S2, and/or S3 may be used to determine whether an offset value should be used for the determination of the signal within the coil, such as whether the conductor is sufficiently close to the closure. In the event that the conductor is not proximate the closure, then the adjustment may be omitted (or use a unity factor), if desired.

Figure 23:
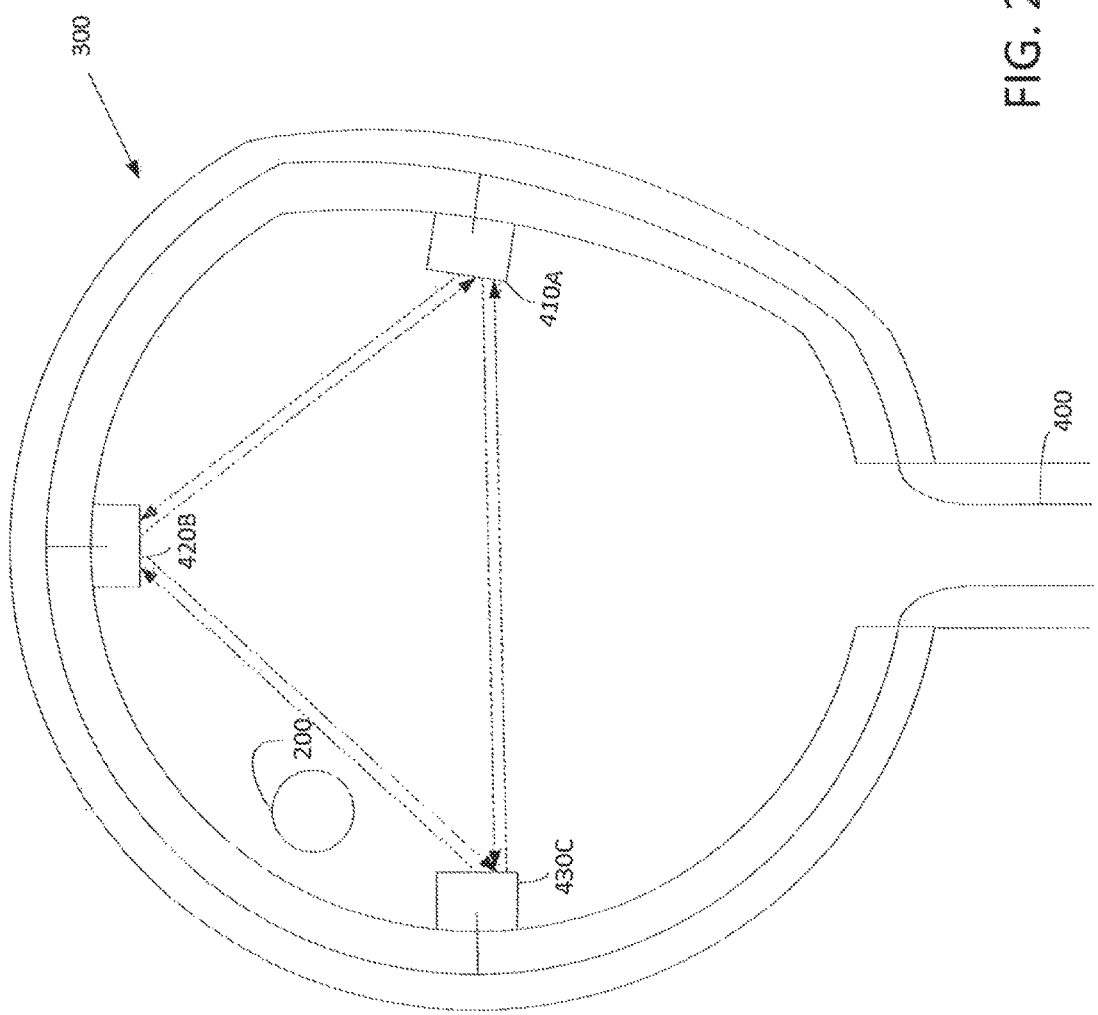
FIG. 23 illustrates a deformed Rogowski coil.

Referring to FIG. 23, often the particular configuration of an installed coil will not be substantially circular, but rather will form a "closed loop" having one or more bends where the spatial relationship between the sensors 410A, 420B, 430C are different than a circular coil. As a result of the bend(s) in the coil, the spatial relationship between the sensors 410A, 420B, 430C, will tend to vary from installation to installation, and thus the determination of the spatial location of the conductor 200 therein will be different relative to the sensors 410A, 420B, 430C. To characterize the spatial relationships of the sensors the installed coil may be calibrated. With the power to the conductor 200 being off, a first signal may be imposed on a first sensor, such as the sensor 410A. The imposed signal may be transmitted to the other sensors 420B, 430C and the magnitude thereof may be used to determine the distance of the other sensors 420B, 430C from the sensor 410A. This process may be repeated for the sensor 420B and for the sensor 430C. In this manner, the distance other characteristics may be determined between each of the sensors 410A, 420B, 420C and in some manner characterize the spatial relationship for the sensors.

Other techniques may likewise be used to determine the spatial locations of the sensors 410A, 420B, 420C, including those which may be used. By way of example, with a signal being included within the conductor 200, the sensors may emit a signal having a different frequency and or characteristic than that of the conductor which may be differentiated from the signal included within the conductor 200. A set of different frequencies from each sensor may be used or a time division based technique may be used to differentiate signals from each sensor.

Figure 24:
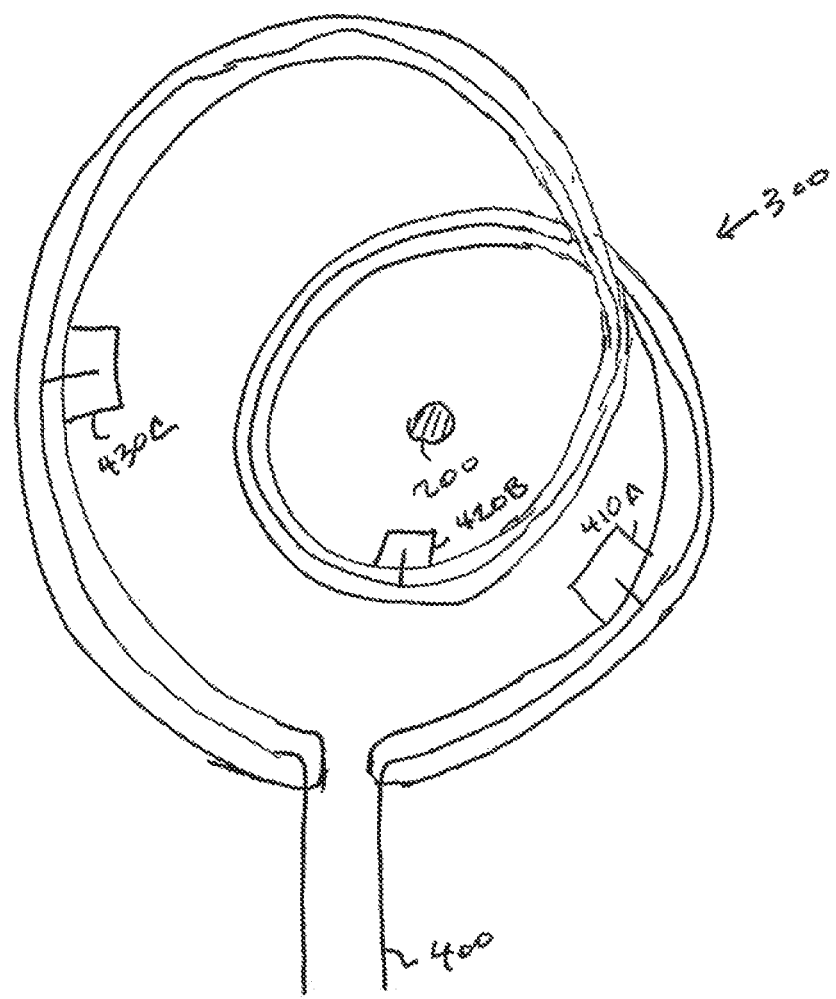
FIG. 24 illustrates a double-coiled Rogowski coil.

Referring to FIG. 24, often the particular configuration of an installed coil will not be substantially circular, but rather will form a "closed loop" having one or more bends in addition to being looped at least twice around the conductor 200 where the spatial relationship between the sensors 410A, 420B, 430C are different than a generally circular coil. As a result of the bend(s) in the coil, the spatial relationship between the sensors 410A, 420B, 430C, will tend to vary from installation to installation, and thus the determination of the spatial location of the conductor 200 therein will be different relative to the sensors 410A, 420B, 430C. To characterize the spatial relationships of the sensors the installed coil may be calibrated. With the power to the conductor 200 being off, a first signal may be imposed on a first sensor, such as sensor 410A. The imposed signal may be transmitted to the other sensors 420B, 430C and the magnitude thereof may be used to determine the distance of the other sensors 420B, 430C from the sensor 410A. This process may be repeated for the sensor 420B and for the sensor 430C. In this manner, the distance may be determined between each of the sensors 410A, 420B, 420C. In addition, if the system is able to determine that a double loop has been included then if the sensor has different characteristics in such a deformed state, then the calibration characteristics may be modified, as desired. In addition, the calibration may be performed with the conductor 200 being active. In addition, the sensing may be adjusted to account for multiple loops around the conductor, even with a coil including a single sensor.

Other techniques may likewise be used to determine the spatial locations of the sensors 410A, 420B, 420C, especially suitable for multiple loops. By way of example, with a signal being included within the conductor 200, the sensors may emit a signal having a different frequency and or characteristic than that of the conductor which may be differentiated from the signal included within the conductor 200.

Figure 25:
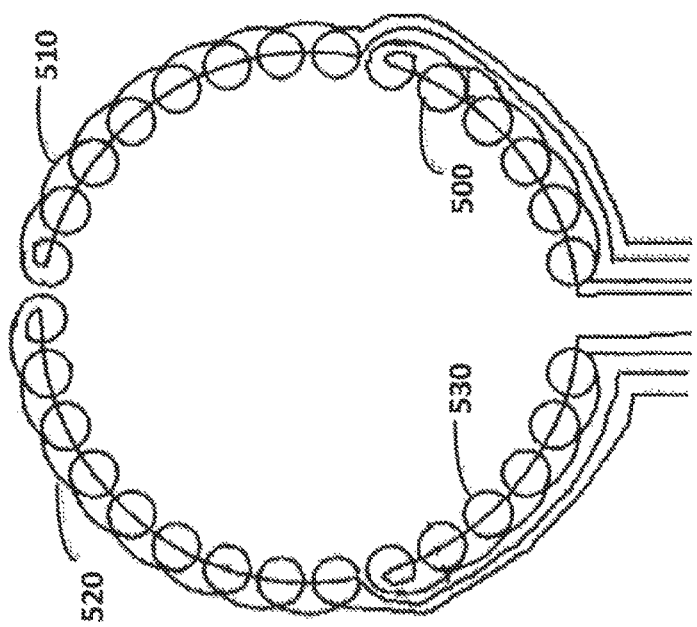
FIG. 25 illustrates another embodiment of a Rogowski coil.

Referring to FIG. 25, a coil may include a set of sensors 500, 510, 520, 530, each of which comprises of one or more wires wound around a central core. in this manner, each of the sensors 500, 510, 520, 530 may be spatially distributed around the coil. The sensors 500, 510, 520, 530 may be non-overlapping with respect to one another. Alternatively, the sensors 500, 510, 520, 530 may be overlapping with respect to one another. Alternatively, some of the sensors 500, 510, 520, 530 may be overlapping with respect to one another and some of the sensors 500, 510, 520, 530 may be non-overlapping with respect to one another. The sensors 500, 510, 520, 530 may include a separate interior return path wire and/or an external return path wire, if desired.

The amplifier 310, integrator 320, adjustment module 460, and location module 450 collectively referred to as the sensing module 335 (see FIG. 18) are preferably located in a position proximate the coil 300 and otherwise connected to the coil. The signal from the one or more sensors may be used as a power source for the electronics included with the sensing module 335. Alternatively, the sensing module 335 may be externally powered, powered with a battery, or otherwise.

Figure 26:
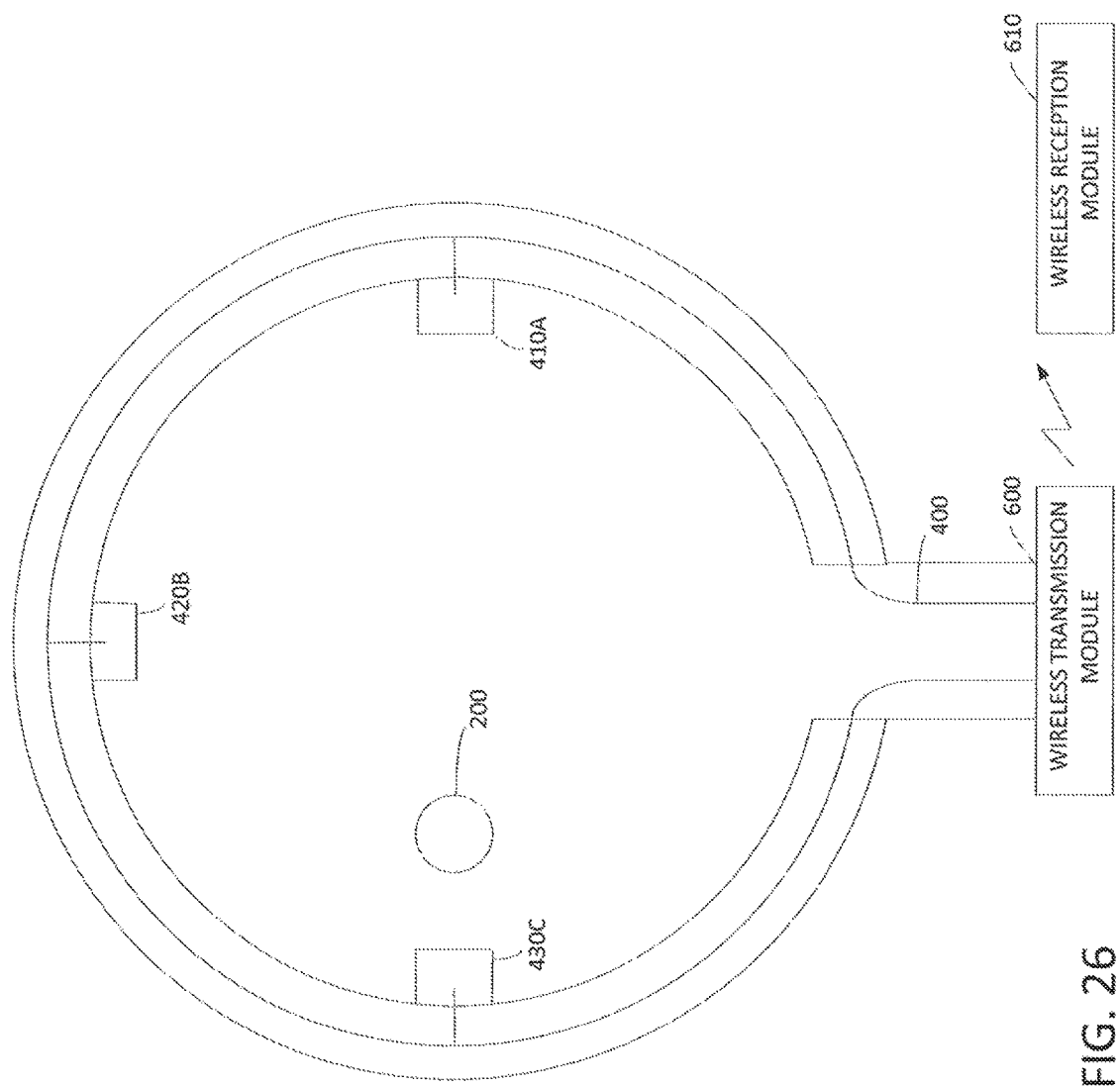
FIG. 26 illustrates a Rogowski coil with a wireless transmission module.

Referring to FIG. 26, the coil may include a wireless transmission module 600 to receive the signal from the sensor(s) and wirelessly transmit a corresponding signal to a wireless reception module 610. The wireless reception module 610 may provide the received signal to the sensing module 335. In this manner, the flexibility of interconnecting the coils to the corresponding conductor is not hampered by the need to route wires thereto.

In another embodiment, the location module 550 determines an adjustment value based upon the anticipated physical deformations of the loop (such as coiled twice around the conductor).

The offset value, position value, physical deformations, or otherwise, may be provided to an adjustment module 460 that is used as the basis to modify the output signal 330 to a modified value 470. By way of example, if the location module 450 indicates that the conductor 200 is proximate the closure mechanism, then the value of the output signal 330 may be increased in a suitable manner. By way of example, if the location module 450 indicates that the conductor 200 is proximate the far end of the loop from the closure mechanism, then the value of the output signal may be decreased in a suitable manner. By way of example, if the location module 450 indicates that the coil is wound twice (or more), then the output signal may likewise be suitably modified.

In another embodiment of the coil includes a substantially greater number of sensors. In this manner, a finer granularity of the location of the current sensor and/or the configuration of the loop may be determined.

In another embodiment a conductive based core, such as a ferrite core, may be used as the current transformer. In addition, the current transformer may be a solid core or a split core current transformer.

In another embodiment, the Rowogski coils may omit the sensors if desired. A plurality of lengths of Rogowski coil may be combined together to form a larger loop that is more suitable for encircling larger conductive conductor regions and/or encircling the same conductor a plurality of times for increased sensitivity. In this case, a first end of a first Rogowski coil is attached to a second end of a second Rogowski coil using a coupling structure. Preferably, the conductor of the first Rogowski coil is electrically connected to the conductor of the second Rogowski coil, preferably through use of the coupling structure. The second end of the first Rogowski coil and the first end of the second Rogowski coil are coupled together thus forming at least one loop around a conductor to be measured. In this manner, a longer Rogowski coil may be readily assembled from two or more shorter Rogowski coils.

In another embodiment, a picture may be taken of the assembled Rogowski coil encircling the conductor, such as by using a mobile phone. The picture may be used by a computer program to analyze the relative location of the sensors to assist in the calibration of the sensors. One or more of the parameters of a module may be updated based upon the picture. In some cases, multiple loops around the same conductor may be readily determined.

It is to be understood that the claims are not limited to the precise configuration and components illustrated above. Various modifications, changes and variations may be made in the arrangement, operation and details of the systems, methods, and apparatus described herein without departing from the scope of the claims.

The invention claimed is:

1. A coil for sensing a changing current comprising:
   (a) an elongate substantially flexible core material, said elongate substantially flexible core material having a first end portion and a second end portion, said elongate substantially flexible core material having a middle portion between said first end portion and said second end portion, said second end portion at an opposite end of said elongate substantially flexible core material than said first end portion;
   (b) a plurality of sensors positioned at a spaced apart location from one another and supported by said middle portion of said substantially flexible core material;
   (c) said first end portion and said second end portion maintained in a position proximate one another;
   (d) a sensing module that receives an input signal from each of said plurality of sensors, where each of said input signals are electrically isolated from one another, and estimates a load signal within a conductor associated within said elongate substantially flexible core material based upon said input signal from each of said plurality of sensors.

2. The coil of claim 1 wherein said elongate substantially flexible core material is substantially round in cross section.

3. The coil of claim 2 wherein each of said sensors include a conductive wire wrapped around said substantially flexible core material.

4. The coil of claim 1 wherein said sensing module includes an amplification circuit for said input signal from each of said plurality of sensors.

5. The coil of claim 4 wherein said sensing module includes an integration circuit for said input signal from each of said plurality of sensors.

6. The coil of claim 1 wherein said input signal for each of said plurality of sensors is received separately from the other said plurality of input signals.

7. The coil of claim 6 wherein said sensing module modifies said estimation of said load signal within said conductor based upon a location of said conductor with respect to said elongate substantially flexible core material.

8. The coil of claim 1 wherein said sensing module modifies said estimation of said load signal within said conductor based upon a location of said conductor with respect to said first end portion.

9. The coil of claim 1 wherein said sensing module modifies said estimation of said load signal in such a manner to adjust for the shape of said elongate substantially flexible core material.

10. The coil of claim 1 wherein said sensing module modifies said estimation of said load signal in such a manner to adjust for said elongate substantially flexible core material encircling said conductor a plurality of times.

11. The coil of claim 1 wherein said sensing module is updated based upon a picture of said elongate substantially flexible core material.

12. The coil of claim 1 of wherein said sensing module and said plurality of sensors are powered by the same power source.

13. The coil of claim 1 wherein each of said plurality of sensors are powered by an external power source.

14. The coil of claim 1 wherein said input signal from each of said plurality of sensors is a composite signal on a single wire.

15. The coil of claim 1 wherein a first said input signal from a first one of said plurality of sensors is amplified and integrated to determine a first amplified integrated signal, a second said input signal from a second one of said plurality of sensors is amplified and integrated to determine a second amplified integrated signal, a location module determines a location of said conductor with respect to said elongate substantially flexible core material based upon said first amplified integrated signal and said second amplified integrated signal.

16. The coil of claim 15 wherein said estimation of said load signal within said conductor is based upon said location from said location module.

17. The coil of claim 1 wherein said sensing module determines a first sufficiency measure to determine whether an offset measure is used to estimate said load signal within said conductor.

18. The coil of claim 17 wherein said sensing modules determines a second sufficiency measure to determine whether said offset measure is used to estimate said load signal within said conductor.

19. The coil of claim 1 wherein said sensing module determines whether said elongate substantially flexible core material includes a plurality of loops around said conductor.

20. The coil of claim 1 wherein said sensing module determines a spatial relationship between said plurality of sensors.

21. The coil of claim 20 wherein said spatial relationship is determined based upon a signal imposed upon respective said plurality of sensors.

22. The coil of claim 1 wherein said plurality of sensors are overlapping with one another.

23. The coil of claim 1 wherein said plurality of sensors are non-overlapping with one another.

24. The coil of claim 1 wherein said plurality of sensors and said sensing module are interconnected by a wireless transmission module and a wireless reception module, respectively.

* * * * *